United States Patent [19]

Kagami et al.

[11] Patent Number: 5,171,657
[45] Date of Patent: Dec. 15, 1992

[54] LIGHT SENSITIVE IMAGE FORMING MEDIUM

[75] Inventors: Kenji Kagami; Akihiro Mouri, both of Atsugi; Masato Katayama, Yokohama; Kazuo Isaka, Tokyo; Tetsuro Fukui; Susumu Nakamura, both of Kawasaki; Masao Suzuki, Tokyo, all of Japan

[73] Assignees: Canon Kabushiki Kaisha; Oriental Photo Industrial Co., Ltd., Tokyo, Japan

[21] Appl. No.: 777,440

[22] Filed: Oct. 15, 1991

Related U.S. Application Data

[63] Continuation of Ser. No. 416,008, Oct. 2, 1989, abandoned.

[30] Foreign Application Priority Data

Oct. 4, 1988 [JP] Japan .................. 63-250172
Oct. 4, 1988 [JP] Japan .................. 63-250174
Oct. 4, 1988 [JP] Japan .................. 63-250176
May 25, 1989 [JP] Japan .................. 1-130164
Jul. 13, 1989 [JP] Japan .................. 1-182033

[51] Int. Cl.$^5$ .......................................... G03C 1/492
[52] U.S. Cl. ............................. 430/271; 430/227; 430/256; 430/261; 430/281; 430/292; 430/330; 430/348; 430/349; 430/374; 430/496
[58] Field of Search ............ 430/271, 281, 330, 138, 430/227, 236, 261, 292, 348, 349, 374, 496, 592

[56] References Cited

U.S. PATENT DOCUMENTS

| | | | |
|---|---|---|---|
| 3,874,947 | 4/1975 | Hayakawa et al. | 96/51 |
| 4,021,240 | 5/1977 | Cerequone et al. | 96/29 |
| 4,123,274 | 10/1978 | Knight et al. | 96/66 |
| 4,220,709 | 9/1980 | deMauriac | 430/353 |
| 4,624,910 | 11/1986 | Takeda | 430/203 |
| 4,629,676 | 12/1986 | Hayakawa et al. | 430/203 |
| 4,649,098 | 3/1987 | Takeda | 430/270 |
| 4,833,062 | 5/1989 | Kakimi | 430/138 |
| 4,842,977 | 6/1989 | Kakimi | 430/138 |
| 4,850,947 | 5/1989 | Oka | 430/138 |
| 4,879,200 | 11/1989 | Oka | 430/138 |
| 4,897,335 | 1/1990 | Kakimi | 430/138 |
| 4,910,115 | 3/1990 | Simpson et al. | 430/138 |
| 4,913,999 | 4/1990 | Tamagawa et al. | 430/138 |
| 4,920,027 | 4/1990 | Kakimi | 430/138 |
| 4,933,256 | 7/1990 | Kakimi | 430/138 |
| 4,939,064 | 7/1990 | Nakamura | 430/138 |
| 4,959,291 | 9/1990 | Hakada et al. | 430/138 |

FOREIGN PATENT DOCUMENTS

| | | |
|---|---|---|
| 202490 | 11/1986 | European Pat. Off. . |
| 326424 | 8/1989 | European Pat. Off. . |
| 328364 | 8/1989 | European Pat. Off. . |
| 330504 | 8/1989 | European Pat. Off. . |
| 27132 | 3/1981 | Japan . |
| 118638 | 7/1983 | Japan . |
| 118639 | 7/1983 | Japan . |
| 53831 | 3/1984 | Japan . |
| 55429 | 3/1984 | Japan . |

OTHER PUBLICATIONS

T. H. James, "The Theory of the Photographic Process", Fourth Edition, Macmillan Publishing Co., Inc., pp. 353–361.
Patent Abstrat of Japan, vol. 6, No. 245 (P-159) (107), Dec. 3, 1982, (JP-57-142638 (Fuji) Sep. 3, 1982).

*Primary Examiner*—Jack P. Brammer
*Attorney, Agent, or Firm*—Fitzpatrick, Cella, Harper & Scinto

[57] ABSTRACT

An image forming method comprising;
subjecting an image forming medium containing at least a photosensitive silver halide, an organic silver salt, a reducing agent, a polymerizable polymer precursor and a photopolymerization initiator, to imagewise exposure, followed by heating to produce a light-absorbing organic compound in said image forming medium; and subjecting said image forming medium in which said light-absorbing organic compound has been produced, to polymerization exposure to cause said polymerizable polymer precursor to polymerize; where the light-absorbing characteristics of said light-absorbing organic compound are utilized to suppress the polymerization of said polymerizable polymer precursor at the area at which said light-absorbing organic compound has been produced.

18 Claims, 5 Drawing Sheets

LIGHT SENSITIVE IMAGE FORMING MEDIUM

This application is a continuation of application Ser. No. 07/416,008 filed Oct. 2, 1989, now abandoned.

BACKGROUND OF THE INVENTION

1. Field of the Invention

The present invention relates to an image forming method that forms a polymer image by the action of light, and also to an image forming medium.

2. Related Background Art

Energies used to form or record an image include light, sound, electricity, magnetism, heat, radiations such as electron rays and X-rays, and chemical energy, among which, in particular, widely used are light, electricity, heat energy, or a combination of any of these.

For example, the image forming method that employs the combination of light energy with chemical energy includes a silver salt photographic process and a method in which a diazo copying paper is used. The method that employs the combination of light energy with electric energy includes an electrophotographic system. Also, the method that utilizes heat energy includes a method in which a thermal recording paper or transfer recording paper is used. On the other hand, known as the method that utilizes electric energy is a method in which an electrostatic recording paper, electrothermal recording paper, or electrosensitive recording paper is used.

Of the above image forming methods, the silver salt photographic process can obtain an image having a high resolution. The silver salt photographic process, however, requires the developing and fixing that uses complicated liquid compositions, or the drying of an image (or a print).

Now, development is energetically made on image forming methods that can form an image through a simple processing.

For example, U.S. Pat. No. 4,629,676 teaches a method in which polymerization reaction under dry (thermal) conditions is caused by the photosensitive reaction of silver halide that acts as a trigger, to form an image comprising a polymer.

This method has the advantage that any complicated wet processing is not required, but has had the disadvantage that the polymer formation rate (i.e., polymerization rate of a polymeric compound) is so low that it takes a long time to form the polymer image. Incidentally, this disadvantage arises presumably because of a reaction intermediate (which functions as a polymerization initiator) formed in the course of heating, by the reaction between silver produced from silver halide by imagewise exposure and a reducing agent, which intermediate is so stable and has so low activity as the polymerization initiator that the polymerization reaction can not proceed so rapidly.

On the other hand, to cope with this problem to accelerate the polymerization, Japanese Unexamined Patent Publication No. 70836/1987 discloses a method in which a thermal polymerization initiator is used.

This method comprises forming a latent image comprising silver metal produced from silver halide by imagewise exposure, converting, under heating, a reducing agent into an oxidized product having a polymerization inhibitory power different from that of said reducing agent by utilizing a catalytic action of the above silver metal, thereby producing a difference in the polymerization inhibitory power between the reducing agent and the resulting oxidized product and also causing a thermal polymerization reaction utilizing the thermal polymerization initiator, thus forming a polymer image corresponding with the difference in the polymerization inhibitory power.

This method, however, has been involved in the disadvantage that a good contrast can be made with difficulty in the polymer image.

This disadvantage arises presumably because the oxidation-reduction reaction taking place in a latent image portion to form the oxidized product and the polymerization reaction to form the polymer image are allowed to take place in the same heating step, so that these reactions may proceed in a competitive fashion and thus the respective reactions may not proceed in a good efficiency.

Also, the image formation according to this method is very unstable in that, for example, the areas on which the polymer is formed may turn into exposed areas or unexposed areas only because of a slight change in the amount of the reducing agent.

In addition, U.S. Pat. No. 4,649,098 discloses a method in which a reducing agent having a polymerization inhibitory power is brought into an oxidized product by imagewise consumption (at imagewise exposed areas) in the course of the developing of silver halide, and, after imagewise inhibition (at imagewise unexposed areas) of polymerization reaction by the action of the residual reducing agent, light energy is uniformly applied (whole areal exposure) from the outside to cause photopolymerization at the area at which the reducing agent has been consumed (imagewise exposed area), thus forming a polymer image.

The above method has the advantages that it can achieve a high sensitivity in the writing of a latent image since the silver halide is used, and the steps from the writing for the formation of an image up to the whole areal exposure can be separated in a good efficiency. It, however, is difficult to obtain a polymer image having a sufficient contrast. This is caused for the following reason.

The reducing agent used in the above method is in itself a reducing agent that acts as a polymerization inhibitor and turns not to act as the polymerization inhibitor after the reduction of silver halide. Hence the reducing agent at the imagewise exposed area must be sufficiently converted into the oxidized product before the polymerization can be sufficiently achieved. However, the application of heat energy in an sufficient amount in carrying out the development, with the intention to sufficiently convert the reducing agent at the imagewise exposed area into the oxidized product may cause an unauthorized oxidation-reduction reaction at the imagewise unexposed areas. On the other hand, the application of heat energy in a reduced amount in carrying out the development, with the intention to prevent the oxidation-reduction reaction from taking place at the imagewise unexposed area, may conversely make the conversion into the oxidized product at the imagewise exposed areas not to sufficiently proceed. Since in this instance the imagewise exposed area of an oxidation-reduction image is polymerized with difficulty, the light energy in carrying out the whole areal exposure must be applied in an increased amount. This may cause unnecessary polymerization at the unexposed areas with increase in the amount of the light energy. Further, since the silver metal is deposited at the area to be polymerized, the light energy of the whole areal exposure is absorbed so that the imagewise exposed area and unexposed area become different in the point of the irradiation energy. As a result, the polymerization at the unexposed area is more apt to proceed, eventually making it impossible to obtain the polymer image with a sufficient contrast.

The polymer image to be formed according to the methods as described above is an image comprising a polymerized area and an unpolymerized area. Aiming at making this polymer image visible and further forming it into a color image, U.S. Pat. No. 4,649,098 and so forth disclose various methods that utilize the difference in properties and so forth between the polymerized area and unpolymerized area. For example, proposed are a method in which a treatment is made using a liquid that does not dissolve the polymerized area and dissolves the layer of the unpolymerized area, to dissolve out and remove the unpolymerized area (i.e., etching); a method in which, utilizing the difference in adhesion between the polymerized area and unpolymerized area, a sheet such as plastic film is adhered and thereafter peeled to separate the polymerized area and unpolymerized area under dry conditions (i.e., peeling-apart); in the case when the polymer image is formed into a color image, a method in which a photopolymerizable layer is previously colored with use of a pigment or dye, which is then subjected to dissolving-out (i.e., the above etching) or peeling (i.e., the above peeling-apart) to form the color image, or a method in which, utilizing the adhesion at the unpolymerized area, a coloring powder is applied to make selective coloring (i.e., torning or inking), or, utilizing the difference in liquid-permeability between the polymerized area and unpolymerized area, the unpolymerized area is selectively dyed by treating it with a dye solution.

However, no polymer image having a sufficient contrast can be obtained in the conventional polymer image forming methods as discussed above, and hence, even with employment of any of the above methods for making the image visible or forming it into a color image, the visible image and color image which are obtained from such a polymer image can not have any sufficient contrast, and particularly it has been difficult to obtain highly detailed visible image and color image.

Japanese Unexamined Patent Publication No. 55-50246 also discloses a photosensitive lithographic material that has a photopolymerizable composition layer, a transparent intermediate layer and a heat development type photosensitive composition layer, and is capable of forming a polymer image in the photopolymerizable composition layer with utilization of the light-absorption of the metallic silver which is produced at the exposed area of the heat development type photosensitive composition layer as a result of imagewise exposure and heating (a plate is finally obtained by peeling-apart).

The metallic silver, however, has so flat light-absorption characteristics that it is hard to say that the ability to absorb a particular wavelength is satisfactory. Hence, it is necessary for achieving sufficient absorption of light to make the photosensitive layer thick. This results in a lowering of the resolution of the polymer image. When a method is employed in which the quantity of the organic silver salt per unit area is increased to achieve sufficient absorption of light, there also has been the problem that the storage stability of image forming mediums is lowered.

SUMMARY OF THE INVENTION

An object of the present invention is to provide an image forming method, and an image forming medium, that can obtain an image having a superior resolution and contrast even with use of a small amount of organic silver salt.

The image forming method of the present invention comprises;
  subjecting an image forming medium containing at least a photosensitive silver halide, an organic silver salt, a reducing agent, a polymerizable polymer precursor and a photopolymerization initiator, to imagewise exposure, followed by heating to produce a light-absorbing organic compound in said image forming medium; and
  subjecting said image forming medium in which said light-absorbing organic compound has been produced, to polymerization exposure to cause said polymerizable polymer precursor to polymerize;
  where the light-absorption characteristics of said light-absorbing organic compound are utilized to suppress the polymerization of said polymerizable polymer precursor at the area at which said light-absorbing organic compound has been produced.

In another embodiment, the image forming method of the present invention comprises;
  subjecting a photosensitive material containing at least a photosensitive silver halide, an organic silver salt and a reducing agent, to imagewise exposure, followed by heating to produce a light-absorbing organic compound in said photosensitive material;
  laminating a polymerization material containing at least a polymerizable polymer precursor and a photopolymerization initiator, on said photosensitive material in which said light-absorbing organic compound has been produced; and
  subjecting said photosensitive material and said polymerization material to polymerization exposure to cause said polymerizable polymer precursor to polymerize;
  where the light-absorption characteristics of said light-absorbing organic compound are utilized to suppress the polymerization of said polymerizable polymer precursor at the area at which said light-absorbing organic compound has been produced.

The image forming medium of the present invention is characterized by containing at least i) a photosensitive silver halide, an organic silver salt and a reducing agent that react each other to produce a light-absorbing organic compound as a result of imagewise exposure and heating, ii) a polymerizable polymer precursor, and iii) a photopolymerization initiator;
  said light-absorbing organic compound being capable of absorbing light with wavelengths to which said photopolymerization initiator has a sensitivity.

DETAILED DESCRIPTION OF THE PREFERRED EMBODIMENTS

Figure 1:
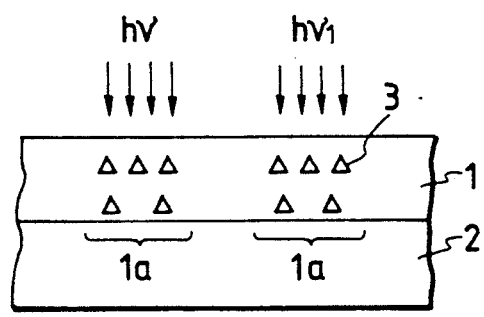
FIGS. 1 to 3 are side views to illustrate an example of the step of imagewise exposure, the step of heating and the step of polymerization, respectively, of the present invention.

As shown in FIG. 1, the image forming medium of the present invention comprises at least an image forming layer 1 provided on a support 2. The image forming layer 1 contains a photosensitive silver halide, an organic silver salt, a reducing agent, a polymerizable polymer precursor, and a photopolymerization initiator. In the image forming medium of the present invention, the organic silver salt and reducing agent contained in the image forming layer 1 undergo oxidation-reduction reaction as a result of subjecting the image forming layer 1 to exposure and heating (heat development), and the oxidized product produced as a result of the reaction serves as the light-absorbing organic compound. Alternatively, the oxidized product produced as a result of the reaction between the organic silver salt and reducing agent further reacts with a coupler to produce the light-absorbing organic compound.

Now, to form an image by using the above image forming medium, the image forming layer 1 on the support 2 is, as shown in FIG. 1, first imagewise exposed to light in a desired form in the step of imagewise exposure, according to analog exposure using a mask or the like, or digital exposure in which exposure is carried out using a laser or the like according to image signals such as external electric signals or light signals (hv1). As a result, silver metal 3 is produced from the photosensitive silver halide present in the imagewise exposed area 1a, and this forms a latent image. The silver metal 3 serves as a catalyst for the thermal reaction between the organic silver salt and reducing agent.

As conditions for the exposure to light in carrying out the writing of this latent image, conditions under which the resulting polymer image can obtain the desired performance such as sufficient contrast may be used by appropriately selecting them depending on the concentration, type and so forth of the silver halide incorporated into the image forming layer.

The image forming method of the present invention, which employs the photosensitive silver halide in the step of imagewise exposure, enables highly sensitive writing.

Figure 2:
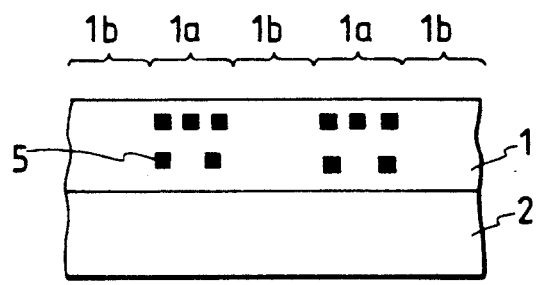

Next, in the step of heating, the image forming layer 1 in which the latent image has been formed is heated, so that as shown in FIG. 2 the silver metal 3 selectively acts as a catalyst in the imagewise exposed area 1a, where the organic silver salt reacts with the reducing agent. The organic silver salt is reduced to a silver atom (metallic silver) and at the same time the reducing agent is oxidized to form an oxidized product 5. This oxidized product 5 has light absorption. In another instance, the oxidized product 5 further reacts with a coupler to produce an organic compound that exhibits light absorption.

The heating in this heating step is carried out under appropriate selection of conditions necessary for the progress of oxidation-reduction reaction and the formation of the light-absorbing organic compound. The heating temperature depends on the composition of mediums and can not be sweepingly defined. However, the heating may preferably be carried out at a temperature of from 60° C. to 200° C., and more preferably from 100° C., to 150° C., for 1 second to 5 minutes, and more preferably for 3 seconds to 60 seconds. In general, high temperatures can complete the heating in a short time and low temperatures may require the heating to be carried out for a long time. A heating means includes a method in which a hot plate, a heat roll, a thermal head or the like is used, as well as a method in which a heating element provided on the support is electrified to carry out heating, or a method in which the heating is carried out by irradiation with laser beams.

Subsequently, in the step of polymerization, the image forming layer 1 is subjected to polymerization exposure (hv2).

Figure 3:
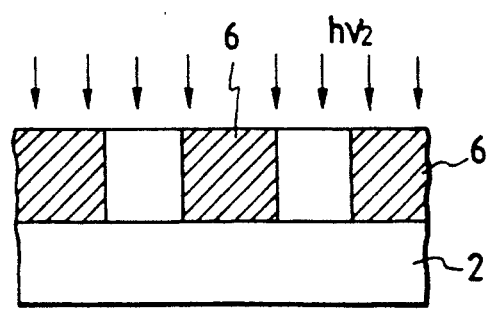

As a result of the polymerization exposure (hv2) on the whole surface of the image forming layer 1, the polymerizable polymer precursor is polymerized by the action of the photopolymerization initiator. On the other hand, the light-absorbing organic compound is present at the imagewise exposed area 1a, and therefore the light with wavelengths for the polymerization exposure is absorbed into that area, so that no polymerization proceeds there, compared with the imagewise unexposed area 1b. Hence, a difference in the state of polymer formation occurs between the imagewise exposed area 1a and imagewise unexposed area 1b, so that a polymer area 6 as shown in FIG. 3 is selectively formed. In other words, there is formed the polymer image.

In the step of polymerization, the light used in subjecting the image forming layer to the polymerization exposure is the light with wavelengths to which the photopolymerization initiator (in the present invention, photopolymerization initiator is defined to include a sensitizer) has a sensitivity and also which the light-absorbing organic compound can absorb (i.e., light with effective wavelengths).

However, light with wavelengths other than the light with effective wavelengths may also be used in combination within the purport that the desired polymer image can be obtained. In instances in which the wavelength regions must be limited, the exposure may be carried out using, for example, a filter that does not allow certain wavelength light to pass.

In the present invention, the light-absorption characteristics of the light-absorbing organic compound and the light-absorption characteristics of the photopolymerization initiator may preferably meet the conditions described below, in order that the light with effective wavelengths is present and an image with a good contrast can be formed. In the present invention, the light-absorption characteristics are measured using UVI-DEC-650, manufactured by Nippon Bunko Kogyo K.K. Air was used as the reference.

The light-absorption characteristics of the light-absorbing organic compound show an absorption peak in a specific wavelength. The absorption peak of this light-absorbing organic compound can be substantially specified by measuring the light-absorption characteristics $f(\lambda)$ at the area imagewise exposed to light and heated, of an image forming medium, as shown in FIG. 4, at the time the light-absorbing organic compound has been produced in the image forming layer, in other words, at the time the imagewise exposure step and heating step have been completed.

The light-absorption characteristics at the area imagewise exposed to light and heated, of the image forming medium may largely vary in the O.D value $A_1$ depending on conditions in the imagewise exposure step and heating step, and hence, in the present invention, the light-absorption characteristic observed when $A_1 = 3.0$ is regarded as $f(\lambda)$.

Figure 4:
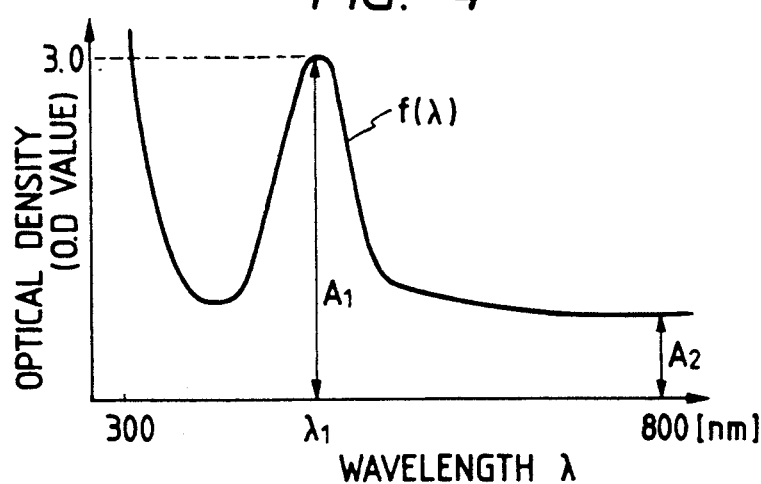
FIG. 4 is a graph to show an example of the light-absorption characteristics at the area having been imagewise exposed to light and heated, of an image forming medium.

Incidentally, the light-absorption characteristic $f(\lambda)$ shown in FIG. 4 not only indicates the light-absorption characteristics of the light-absorbing organic compound but also includes the light-absorption characteristics of other components, e.g., the photopolymerization initiator having an absorption peak. For this reason, the wavelength $\lambda_1$ at an absorption peak of $f(\lambda)$ can not necessarily be said to be the absorption peak wavelength of the light-absorbing organic compound.

Figure 5:
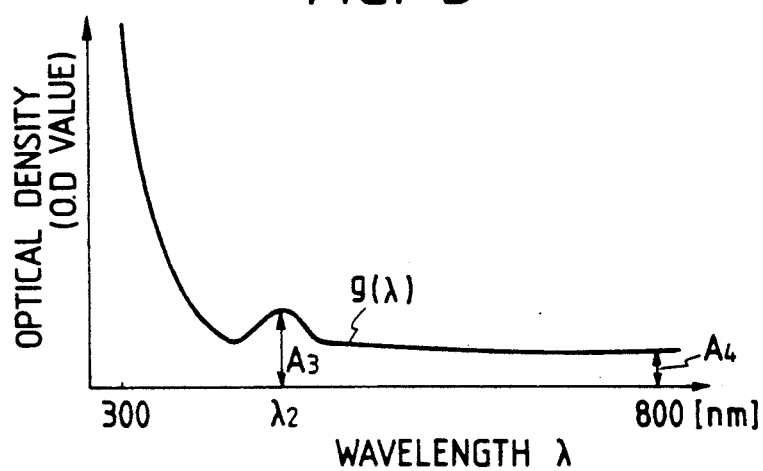
FIG. 5 is a graph to show an example of the light-absorption characteristics at the area having not been imagewise exposed to light and heated, of an image forming medium.
Figure 6:
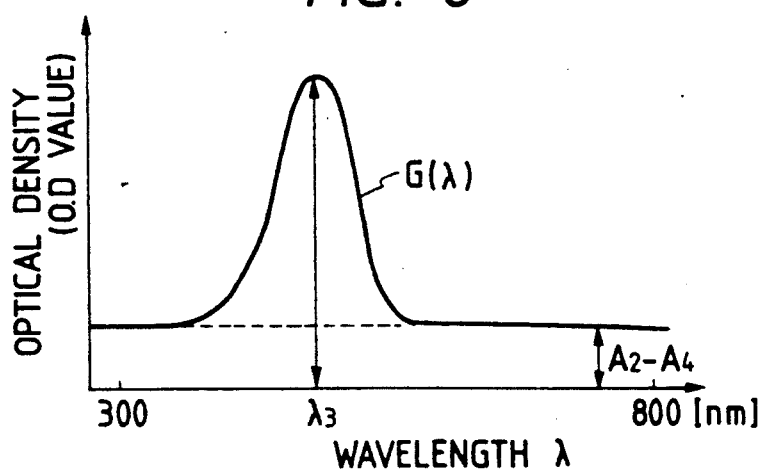
FIG. 6 is a graph to show an example of a first-difference spectrum.

Now, the light-absorption characteristic $g(\lambda)$ (FIG. 5) of the image forming medium which is in the state that the light-absorbing organic compound has not been produced, i.e., which has not been imagewise exposed to light nor heated is measured, and a first-difference spectrum $G(\lambda)$ is found by subtracting $g(\lambda)$ from $f(\lambda)$ as shown in FIG. 6. Thus, the absorption peak wavelength $\lambda_3$ of this first-difference spectrum $G(\lambda)$ is found. The first-difference spectrum $G(\lambda)$ corresponds to the light-absorption characteristics from which the influences by the photopolymerization initiator and other components have been removed, so that the absorption peak wavelength $\lambda_3$ of $G(\lambda)$ coincides with the absorption peak wavelength of the light-absorbing organic compound, and $G(\lambda_3)$ represents optical density at $\lambda_3$. Since, however, the light-absorption characteristics $f(\lambda)$ of the image forming medium having been imagewise exposed to light and heated include the light-absorption characteristics of the metallic silver produced as a result of imagewise exposure and heating (no metallic silver is produced at the area having been not imagewise exposed to light and hence the light-absorption characteristics of the metallic silver is not included in $g(\lambda)$, the first-difference spectrum $G(\lambda)$ also includes the light-absorption characteristics of the metallic silver. The metallic silver, however, shows substantially a constant light absorption and has no large absorption peak. Hence, the absorption peak wavelength $\lambda_3$ of the first-difference spectrum $G(\lambda)$ corresponds to the absorption peak wavelength of the light-absorbing organic compound.

The light-absorption characteristics of the metallic silver is substantially constant as mentioned above. Thus the flat part in $G(\lambda)$ in FIG. 6 indicates the light-absorption characteristics of the metallic silver. In the present invention, the absorption $(A_2-A_4)$ at a wavelength of 800 nm is regarded as the light-absorption characteristics of the metallic silver. $A_2$ represents the absorption at 800 nm of $f(\lambda)$, and $A_4$, the absorption at 800 nm of $g(\lambda)$. The difference between $A_2$ and $A_4$ is due to the fact that the metallic silver has been formed at the exposed area.

In the present invention, a great difference between the wavelength that gives the absorption peak of the light-absorbing organic compound and the wavelength that gives the absorption peak of the photopolymerization initiator may result in a lowering of the action attributable to the light-absorbing organic compound to make it difficult to obtain a sharp image.

Figure 7:
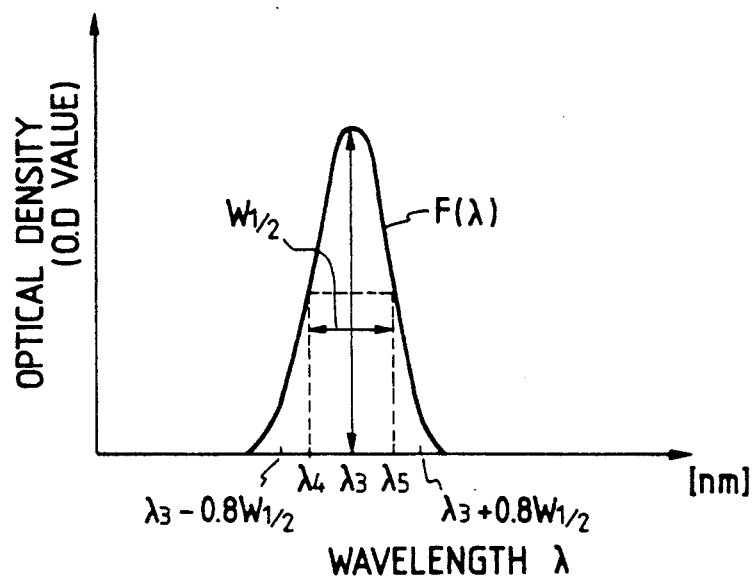
FIG. 7 is a graph to show an example of a second-difference spectrum.

Researches made by the present inventors revealed that, forming an idea of a second-difference spectrum $F(\lambda)$ (FIG. 7) obtainable by further subtracting the absorption of the metallic silver $(A_2-A_4$ in FIG. 6) from the first-difference spectrum $G(\lambda)$, a sharp image can be obtained when, assuming the halfwidth of this second-difference spectrum $F(\lambda)$ as $W_{\frac{1}{2}}$, the wavelength $\lambda_6$ that gives the absorption peak of the photopolymerization initiator is within the range of $\lambda_3 \pm 0.8\ W_{\frac{1}{2}}$, and more preferably within the range of $\lambda_3 \pm 0.5\ W_{\frac{1}{2}}$; in other words, assuming $\lambda_6 = \lambda_3 \pm a\ W_{\frac{1}{2}}$, a may preferably satisfy $0 \leq a \leq 0.8$, and more preferably $0 \leq a \leq 0.5$.

The second-difference spectrum $F(\lambda)$ does not include the light-absorption characteristics of the metallic silver, and hence can be regarded as the light-absorption characteristics of only the light-absorbing organic compound. Based on this second-difference spectrum $F(\lambda)$, $\lambda_4$ and $\lambda_5$ corresponding to $\frac{1}{2}F(\lambda_3) = F(\lambda_4) = F(\lambda_5)$ are primarily determined to find the half-width of $W_{\frac{1}{2}} = \lambda_5 - \lambda_4$.

Figure 8:
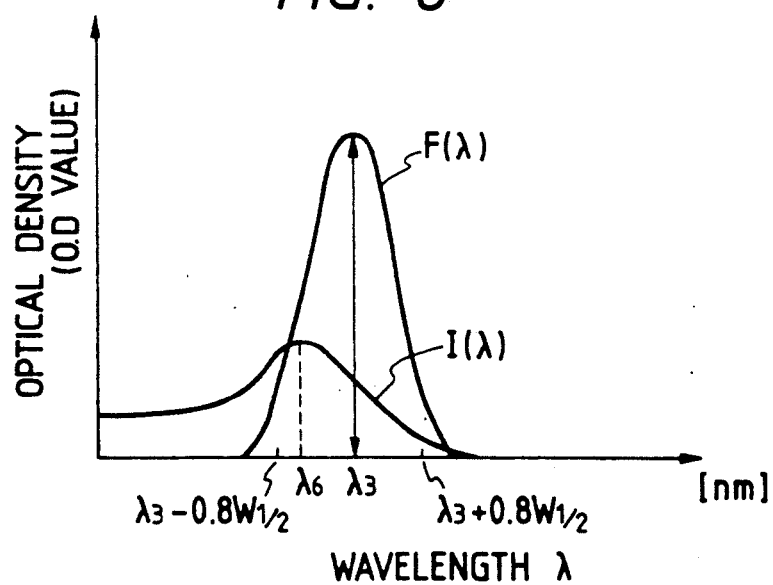
FIG. 8 is a graph to show an example of the relationship between the absorption peak wavelength $\lambda_3$ of the light-absorbing organic compound and the absorption peak wavelength $\lambda_6$ of the photopolymerization initiator in the present invention.

FIG. 8 shows the relationship between the absorption peak wavelength $\lambda_3$ of the light-absorbing organic compound and the absorption peak wavelength $\lambda_6$ of the photopolymerization initiator in the present invention. In FIG. 8, $I(\lambda)$ represents the light-absorption characteristics of the photopolymerization initiator.

As will be detailed later, in the instance where the image forming layer is separated into a photosensitive layer and a polymerizing layer, and, after the photosensitive layer has been imagewise exposed to light and heated, the photosensitive layer and polymerizing layer are laminated to form a polymer image (separation process), the $f(\lambda)$ may be regarded as the light-absorption characteristics of a photosensitive material having been imagewise exposed to light and heated to have $A_1 = 3.0$, and the $g(\lambda)$ may be regarded as the light-absorption characteristics of a photosensitive material having not been imagewise exposed to light and heated. In this instance, the absorption peak wavelength of the photopolymerization initiator can be specified from the absorption peak wavelength of the polymerizing layer on which the light-absorption characteristics have been determined.

In an instance where the image forming layer is constituted of a single layer and, as will be detailed later, in the instance where the image forming layer is constituted of a multiple layer containing the polymerizing layer and photosensitive layer and the polymerizing layer and photosensitive layer have been already laminated before they are imagewise exposed to light, the manner by which $f(\lambda)$ and $g(\lambda)$ are found may be in accordance with what has been already described. In this instance, however, the absorption peak wavelength of the photopolymerization initiator coincides with the absorption peak wavelength of $g(\lambda)$. In other words, $\lambda_2$ coincides with $\lambda_6$.

In FIG. 6, when the relationship between $G(\lambda_3)$ and the optical density $(A_2-A_4)$ of the metallic silver, i.e., $G(\lambda_3)/(A_2-A_4)=k$, is $k \geq 1.5$, a sharp image with a good contrast can be obtained with ease even with use of a small amount of organic silver salt.

In forming an image according to the present invention, the O.D value of the absorption peak (attributable to the light-absorbing organic compound) of the image forming medium (or the photosensitive layer in the instance of the separation process) may preferably be not less than 3.0 at the time the imagewise exposure step and heating step have been completed. When the above $G(\lambda_3)/(A_2-A_4)=k$ is not less than 1.5, the O.D value of the absorption peak of the image forming medium (or the photosensitive layer in the instance of the separation process) can be readily made to be not less than 3.0.

An excessively high O.D value $A_3=g(\lambda_2)$ (the O.D value at the absorption peak of the polymerizing layer, in the instance of the separation process) in respect of $g(\lambda)$ in FIG. 5 may also result in a lowering of the contrast of an image. Thus, the O.D value $A_3=g(\lambda_2)$ may preferably be not more than ½, more preferably not more than ⅓, and particularly preferably not more than ¼, of the absorption peak (attributable to the light-absorbing organic compound) of the image forming medium (or the photosensitive layer in the instance of the separation process) at the time the step of imagewise exposure and the step of heating have been completed.

In the instance where the image forming medium has the support, $f(\lambda)$ and $g(\lambda)$ may be measured in a state that the support has been peeled, or may be measured in a state that it remains unremoved. When, however, the opaqueness of the support makes it impossible to measure the light-absorption characteristics, the support is peeled to carry out the measurement. Also when an anti-halation layer is provided in the image forming medium, this anti-halation layer is peeled to carry out the measurement. Still also when a coloring material layer is provided in addition to the image forming layer or polymerizing layer as will be detailed later, the coloring material layer is removed to carry out the measurement.

As light sources used in the step of imagewise exposure and the step of polymerization, usable are, for example, sunlight, tungsten lamps, mercury lamps, halogen lamps, xenon lamps, fluorscent lamps, LEDs, and lasers, and the wavelength of the light used in these steps may be the same of different. Even if the light having the same wavelength is used, the latent image can be sufficiently written with use of light having an intensity of the level that may not cause photopolymerization in the step of imagewise exposure, since the silver halide usually has a sufficiently higher photosensitivity than the photopolymerization initiator. For example, in the step of imagewise exposure, the exposure may be carried out using light that may give about 1 mJ/cm² or less at the surface of the image forming medium. In the step of polymerization exposure, the exposure may be carried out using light that may give about 500 mJ/cm² or less at the surface of the image forming medium.

In the step of polymerization exposure, the image forming medium may be heated when exposed to light. This may be done by additional heating, or the thermal inertia in the step of heating may be utilized.

Examples of the image forming medium that can be used in the image forming method of the present invention will be described below in detail.

The image forming medium of the present invention contains at least i) a photosensitive silver halide, an organic silver salt and a reducing agent that react each other to produce a light-absorbing organic compound as a result of imagewise exposure and heating, ii) a polymerizable polymer precursor, and iii) a photopolymerization initiator; said light-absorbing organic compound being capbale of absorbing light with wavelengths to which said photopolymerization initiator has a sensitivity.

The photosensitive silver halide used in the medium of the present invention may include silver chloride, silver bromide, silver chlorobromide, silver iodobromide, and silver chloroiodobromide. These may have been subjected to chemical sensitization and optical sensitization as done in respect of usual photographic emulsions. More specifically, the chemical sensitization that can be used includes sulfur sensitization, noble metal sensitization, and reduction sensitization. The optical sensitization that can be applied includes methods using conventionally known sensitizing coloring matters.

The sensitizing coloring matters that may be preferably used include cyanine coloring matters, merocyanine coloring matters, and trinuclear coloring matters, as exemplified by 3,3'-dicarboxyethyl-2,2'-thiacarbocyanine iodide, 3,3'-diethyl-2,2'-thiacarbocyanine iodide, 3,3'-disulfoethyl-2,2'-thiadicarbocyanine bromide, 3,3'-diethyl-2,2'-thiatricarbocyanine iodide, and further the coloring matters having the following structural formula:

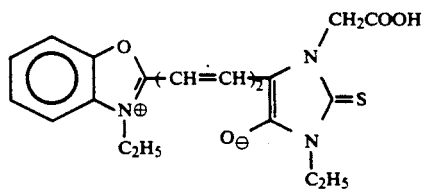

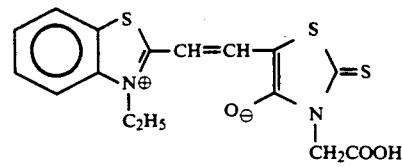

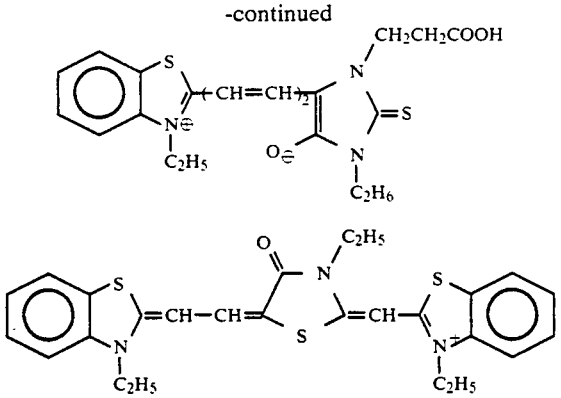

58-118638, sulfobenzotriazole, carboxybenzotriazole or salts thereof, or hydroxybenzotriazole, described in Japanese Unexamined Patent Publication No. 58-118639, 1,2,4-triazole, described in U.S. Pat. No. 4,220,709, or 1H-tetrazole, carbazole, saccharin, imidazole, and derivatives thereof.

The reducing agent that turns into the light-absorbing organic compound as a result of oxidation-reduction reaction includes, for example, the compound represented by the following Formula (I):

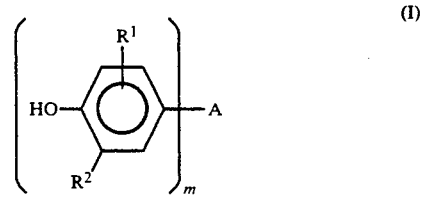

In the above Formula (I), $R^1$ and $R^2$ each independently represent a hydrogen atom, a hydroxyl group, a halogen atom, a substituted or unsubstituted alkyl group, a substituted or unsubstituted alkenyl group, a substituted or unsabstituted alkynyl group, a substituted or unsubstituted cycloalkyl group, a substituted or unsubstituted aralkyl group, an alkoxyl group, or a substituted or unsubstituted amino group; m represents an integer of 1 to 3; and A is a monovalent, divalent or trivalent group and represents a substituted or unsubstituted aralkyl group, a substituted or unsubstituted alkyl group, a substituted amino group, a divalent alkylidene group, a divalent aralkylidene group, or a trivalent methine group.

The halogen composition in a grain may be uniform, or the grain may have a multi-layer structure with different composition. It is also possible to use simultaneously two or more kinds of silver halides having different halogen composition, grain size, grain size distribution, etc.

The organic silver salt that can be used in the medium of the present invention includes organic acid silver salts or triazole silver salts as described in SHASHIN KOGAKU NO KISO (Basic Photographic Engineering), First Edition, published 1982, The Non-silver Salt Volume, p. 247, or Japanese Unexamined Patent Publication No. 59-55429. It is preferred to use silver salts having a low photosensitivity. They include, for example, silver salts of aliphatic carboxylic acids, aromatic carboxylic acids, thiocarbonyl compounds having a mercapto group or α-hydrogen, and imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid. In general, however, silver salts are not stabler as they have a smaller number of carbon atoms, and hence those having an appropriate number of carbon atoms (as exemplified by those having 16 to 26 carbon atoms) are preferred.

The aromatic carboxylic acids include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The compounds having a mercapto or thiocarbonyl group include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atom number of 12 to 23), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication No. 44-30271 or No. 42-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Unexamined Patent Publication No.

In the above Formula (I), The unsubstituted alkyl group represented by $R^1$ and $R^2$ may preferably include a straight-chain or branched alkyl having 1 to 18 carbon atoms, as exemplified by methyl, ethyl, propyl, i-propyl, butyl, t-butyl, i-butyl, amyl, i-amyl, sec-amyl, texyl, 1,1,2,2-tetramethylethyl (hereinafter called "texyl"), heptyl, octyl, nonyl, dodecyl, and stearyl.

The substituted alkyl group represented by $R^1$ and $R^2$ may preferably include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms.

For example, the alkoxylalkyl group includes methoxyethyl, ethoxymethyl, ethoxyethyl, ethoxypropyl, ethoxybutyl, propoxymethyl, propoxybutyl, i-propoxypentyl, t-butoxyethyl, and hexyloxybutyl.

The halogenoalkyl group includes, for example, chloromethyl, chloroethyl, bromoethyl, chloropropyl, chlorobutyl, chlorohexyl, and chloroxyl.

The hydroxyalkyl group includes, for example, hydroxymethyl, hydroxyethyl, hydroxypropyl, hydroxybutyl, hydroxypentyl, hydroxyhexyl, and hydroxyheptyl.

The aminoalkyl group includes, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl, and morpholinobutyl.

The alkenyl group reresented by $R^1$ and $R^2$ includes, for example, vinyl, allyl, pulenyl, butenyl, pentenyl, hexenyl, heptenyl, and octenyl.

The alkynyl group includes, for example, acetyl, propargyl, butynyl, pentynyl, hexynyl, heptynyl, and octynyl.

The cycloalkyl group includes, for example, cyclopentyl, cyclohexyl, and cycloheptyl.

The aralkyl group represented by $R^1$ and $R^2$ includes, for example, benzyl, phenetyl, and tolylmethyl.

The amino group represented by $R^1$ and $R^2$ include, for example, acetylamino, diemthylamino, diethylamino, and amino.

The alkoxyl group represented by $R^1$ and $R^2$ includes, for example, methoxy, ethoxy, and propoxy.

Of the above, the substituents preferred as $R^2$ are a chlorine atom, a bromine atom, methyl, ethyl, i-propyl, t-butyl, sec-amyl, texyl, ethoxymethyl, ethoxyethyl, chloromethyl, hydroxymethyl, aminomethyl, dimethylaminomethyl, and benzyl. The substituents preferred as $R^1$ are a chlorine atom, methyl, ethyl, i-propyl, t-butyl, amyl, texyl, hydroxyl, chloromethyl, hydroxymethyl, benzyl, and cyclohexyl.

As A, the monovalent group substituted or unsubstituted aralkyl group includes, for example, benzyl, p-methoxybenzyl, p-N,N-dimethylaminobenzyl, p-pyrrolidinobenzyl, p-methylbenzyl, p-hydroxybenzyl, p-chlorobenzyl, 3,5-dichloro-4-hydroxybenzyl, 3-methyl-5-t-butyl-4-hydroxybenzyl, o,p-dimethylbenzyl, 3,5-dimethyl-4-hydroxybenzyl, 2-hydroxy-3-t-butyl-5-methylbenzyl, and naphthylmethyl.

The monovalent group substituted or unsubstituted alkyl group includes, for example, methyl, ethyl, i-propyl, N,N-dimethylaminomethyl, N-benzylaminomethyl, methoxymethyl, ethoxymethyl, hydroxymethyl, methoxycarbonylethyl, methoxycarbonylmethyl, ethoxycarbonylethyl, and diethyl phosphonatomethyl.

The monovalent group substituted amino group includes, for example, methylamino, dimethylamino, diethylamino, acetylamino, phenylamino, diphenylamino, and triazinylamino.

The divalent group alkylidene group includes, for example, methylene, ethylidene, propylidene, and butylidene.

The divalent group aralkylidene group includes, for example, benzylidene, p-methylbenzylidene, and p-dimethylaminobenzylidene.

Of the above, preferred groups as A are a monovalent aralkyl group, a divalent alkylidene group or aralkylidene group, and a trivalent methine group. Particularly preferred groups are a monovalent aralkyl group and a divalent alkylidene group.

Of the reducing agents represented by Formula (I), examples of preferred reducing agents are set out below, but are by no means limited to these.

They include 2,4-dimethyl-6-t-butylphenol, 2-methyl-4-i-propyl-6-t-butylphenol, 2,6-di-t-butyl-4-dimethylaminophenol, 2,6-di-t-butyl-4-hydroxymethylphenol, 2-t-butyl-6-benzyl-4-methylphenol, 2,6-di-t-butyl-4-o-tolylmethylphenol, 2,6-di-t-butyl-4-benzylphenol, 2-t-butyl-4-(p-methoxybenzyl)-5-methylphenol, 2,6-dimethyl-4-(α-naphthylmethyl)phenol, 2,6-di-t-butyl-4-(2-hydroxy-3-t-butyl-5-methylbenzyl)phenol, 2-t-butyl-4-(p-chlorobenzyl)-6-cyclohexylphenol, 2-t-butyl-4-(2-hydroxy-3,5-dimethylbenzyl)-5-methylphenol, 2-t-butyl-4-benzyl-6-propargyphenol, 2,6-di-t-butyl-4-(3,5-dichloro-4-hydroxybenzyl)phenol, 2,6-di-t-butyl-4-(3,5-dimethyl-4-hydroxybenzyl)phenol, 2,6-ditexyl-4-(4-hydroxybenzyl)phenol, 2-texyl-4texyl-4-5methylphenol, 2-allyl-4-benzyl-5-methyphenol, 2-texyl-4-(p-chlorobenzyl)-5-allylphenol, 2-chloro-4-dimethylaminomethylphenol, 2,6-di-i-propyl-4-diethylaminophenol, 2-t-butyl-4-(2-hydroxy-3-t-butyl-5-methylbenzyl)phenol, 4,4'-methylenebis(2,6-di-t-butylphenol), 4,4'-methylenebis(2-t-butyl-5-methylphenol), 4,4'-methylenebis(2-t-butyl-6-methylphenol), 4,4'-methylenebis(2-texyl-6-methylphenol), 4,4'-methylenebis(2-cyclohexyl-6-methylphenol), 4,4'-methylenebis(2-cyclohexyl-6-butylphenol), 4,4'-ethylidenebis(2-6-di-t-butylphenol), 4,4'-ethylidenebis(2-t-butyl-6-methylphenol), 4,4'-ethylidenebis(2-cyclohexyl-6-methylphenol), 4,4'-ethylidenebis(2-texyl-6-methylphenol), 4,4'-propylidenebis(2,6-di-t-butylphenol), 4,4'-butylidenebis(2-t-butyl-6-methylphenol), 4,4'-butylidenebis(2-texyl-6-methylphenol), 4,4'-butylidenebis(2-cycohexyl-6-methylphenol), bis(3,5-di-t-butyl-4-hydroxyphenyl)phenylmethane, bis(3,5-di-t-butyl-4-hydroxyphenyl) (4-methoxyphenyl)methane, bis(3,5-di-t-butyl-4-hydroxyphenyl) (4-dimethylaminophenyl)methane, tris(3,5-di-t-butyl-4-hydroxyphenyl)methane, bis(3-t-butyl-4-hydroxy-5-methylphenyl)phenylmethane.

Of these, particularly preferred reducing agents are 2,6-di-t-butyl-4-o-tolyltrimethylphenol, 2,6-di-t-butyl-4-benzylphenol, 2,6-di-t-butyl-4-(2-hydroxy-3-t-butyl-5-methylbenzyl)phenol, 2,6-di-t-butyl-4-(3,5-dichloro-4-hydroxybenzyl)phenol, 2-t-butyl-4-(2-hydroxy-3,5-dimethylbenzyl)-5-methylphenol, 4,4'-methylenebis(2,6-di-t-butylphenol), 4,4'-methylenebis(2-t-butyl-5-methylphenol), 4,4'-methylenebis(2-t-butyl-6-methylphenol), 4,4'-ethylidenebis(2-6-di-t-butylphenol), 4,4'-ethylidenebis(2-t-butyl-6-methylphenol), 4,4'-propylidenebis(2,6-di-t-butylphenol), 4,4'-butylidenebis(2-cyclohexyl-6-methylphenol), bis(3,5-di-t-butyl-4-hydroxyphenyl)phenylmethane, bis(3,5-di-t-butyl-4-hydroxyphenyl) (4-methoxyphenyl)methane, bis(3,5-di-t-butyl-4-hydroxyphenyl) (4-dimethylaminophenyl)methane, and tris(3,5-di-t-butyl-4-hydroxyphenyl)methane.

As the reducing agent that turns into the light-absorbing organic compound as a result of oxidation-reduction reaction, the compound represented by the following Formula (II) can also used in the image forming medium of the present invention.

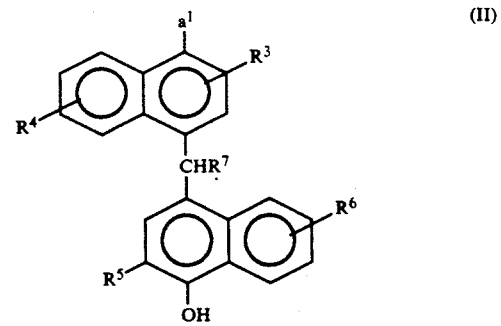

(II)

In the above Formula (II), $R^5$ represents a hydrogen atom, an alkyl group, a cycloalkyl group, or an aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group; and $a^1$ represents a hydrogen atom, a hydroxyl group, a halogen atom, a substituted or unsubstituted alkyl group, a cycloalkyl group, an alkoxyl group, or a substituted or unsubstituted amino group.

The halogen atom represented by $a^1$, $R^3$, $R^4$ and $R^6$ in the above Formula (II) includes a fluorine atom, a chlorine atom, a bromine atom, and an iodine atom.

The alkyl group represented by $a^1$, $R^3$, $R^4$, $R^5$, $R^6$ and $R^7$ may preferably be a substituted or unsubstituted straight-chain or branched alkyl group having 1 to 18 carbon atoms, including, for example, a straight-chain or branched hydrocarbon group such as methyl, ethyl, propyl, i-propyl, butyl, t-butyl, amyl, i-amyl, hexyl, heptyl, octyl, nonyl, dodecyl, or stearyl; a straight-chain or branched alkoxyalkyl group such as methoxyethyl, ethoxyethyl, ethoxypropyl, ethoxybutyl, propoxybutyl, i-propoxypentyl, t-butoxyethyl, or hexyloxybutyl; a hydroxylalkyl group such as hydroxymethyl, hydroxyethyl, hydroxypropyl, hydroxybutyl, hydroxyhexyl, or hydroxyheptyl; an aminoalkyl or alkylaminoalkyl group such as aminomethyl, dimethylaminomethyl, aminoethyl, dimethylaminoethyl, diethylaminoethyl, morpholinoethyl, piperidinoethyl, aminopropyl, diethylaminopropyl, dipropylaminoethyl, aminobutyl, or morpholinobutyl.

The cycloalkyl group represented by $a^1$, $R^3$ and $R^5$ may preferably be a substituted or unsubstituted cycloalkyl group having 5 to 18 carbon atoms, including, for example, cyclopentyl, cyclohexyl, cycloheptyl, cyclooctyl, methylcyclohexyl, dimethylcyclohexyl, and ethylcyclohexyl.

The amino group represented by $a^1$, $R^3$, $R^4$ and $R^6$ may preferably be a substituted or unsubstituted amino group, including, for example, amino, acetylamino, methylamino, dimethylamino, diethylamino, pyrrolidino, morpholino, benzenesulfonamido, toluenesulfonamido, dipropylamino, and dibutylamino.

The aryl group represented by $R^3$, $R^4$, $R^6$ and $R^7$ may preferably be a substituted or unsubstituted aryl group having 6 to 16 carbon atoms, including, for example, phenyl, naphthyl, anthryl, phenanthryl, tolyl, xylyl, cumenyl, mesityl, chlorophenyl, methoxyphenyl, and fluorophenyl.

The alkoxy group represented by $R^3$, $R^4$, $R^6$, $R^7$ and $a^1$, may preferably be a substituted or unsubstituted alkoxy group having 1 to 18 carbon atoms, including, for example, methoxy, ethoxy, propoxy, i-propoxy, and butoxy.

The aralkyl group represented by $R^3$, $R^4$, $R^5$, $R^6$ and $R^7$ may preferably be a substituted or unsubstituted aralkyl group having 7 to 19 carbon atoms, including, for example, benzyl, phenetyl, benzhydryl, trityl, phenylpropyl, naphthylmethyl, chlorobenzyl, dichlorobenzyl, methoxybenzyl, and methylbenzyl.

The acyl group represented by $R^3$, $R^4$ and $R^6$ includes acetyl and propionyl.

Examples of the compound represented by Formula (II) having the above substituent include 4,4'-methylenebis(2-methyl-1-naphthol), 4,4'-methylenebis(2-ethyl-1-naphthol), 4,4'-methylenebis(2-t-butyl-1-naphthol), 4,4'-methylenebis(2-cyclohexyl-1-naphthol), 4,4'-methylenebis(2-t-butyl-6-methyl-1-naphthol), 4,4'-methylenebis(2,6-diethyl-1-naphthol), 4,4'-methylenebis(2-benzyl-1-naphthol), 4,4'-methylenebis(2-t-butyl-8-methyl-1-naphthol), 4,4'-methylenebis(2-methyl-5-chloro-1-naphthol), 4,4'-methylenebis(2-methyl-8-dimethylamino-1-naphthol), 4,4'-methylenebis(2-methyl-5-benzyl-1-naphthol), 4,4'-methylenebis(2-methyl-5-methoxy-1-naphthol), 4,4'-methylenebis(2-methyl-5-phenyl-1-naphthol), 4-(3'-cyclohexyl-4'-hydroxynaphthyl)methyl-2-methyl-1-naphthol, 4-(3'-t-butyl-4'-hydroxynaphthyl)methyl-2-methyl-1-naphthol, 4-(3'-cyclohexyl-4'-hydroxynaphthyl)methyl-2-t-butyl-1-naphthol, 4,4'-benzylidenebis(2-methyl-1-naphthol), 4,4'-benzylidenebis(2-t-butyl-1-naphthol), 4,4'-ethylidenebis(2-methyl-1-naphthol), 4,4'-ethylidenebis(2-t-butyl-1-naphthol), and bis(4-hydroxy-3-methylnaphthyl)tolylmethane.

As another reducing agent that turns into the light-absorbing organic compound as a result of oxidation-reduction reaction, the compound represented by the following Formula (III) can also used in the image forming medium of the present invention.

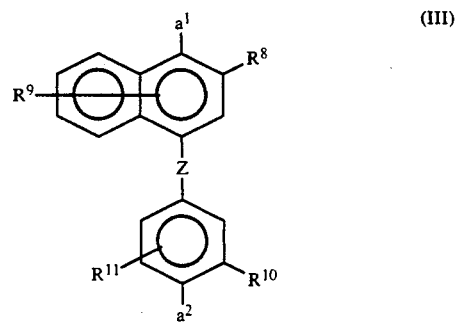

In the above Formula (III), $R^8$, $R^9$, $R^{10}$ and $R^{11}$ each independently represent a substituent selected from the group consisting of a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, and an acyl group; Z represents a divalent group; and $a^1$ and $a^2$ each represent a substituent selected from the group consisting of a hydrogen atom, a hydroxyl group, a halogen atom, a substituted or unsubstituted alkyl group, a cycloalkyl group, an alkoxyl group, and a substituted or unsubstituted amino group, provided that at least one of $a^1$ and $a^2$ is a hydroxyl group.

The halogen atom represented by $R^8$, $R^9$, $R^{10}$, $R^{11}$, $a^1$ and $a^2$ includes a fluorine atom, a chlorine atom, a bromine atom, and an iodine atom.

The alkyl group represented by $R^8$, $R^9$, $R^{10}$, $R^{11}$, $a^1$ and $a^2$ may preferably be a straight-chain or branched alkyl group having 1 to 18 carbon atoms, including, for example, methyl, ethyl, propyl, i-propyl, butyl, t-butyl, i-butyl, amyl, i-amyl, sec-amyl, hexyl, heptyl, octyl, nonyl, dodecyl, and stearyl. The substituted alkyl group may preferably include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms, specifically including, for example, methoxyethyl, ethoxyethyl, ethoxypropyl, ethoxybutyl, propoxybutyl, i-propoxypentyl, t-butoxyethyl, hexyloxybutyl, chloromethyl, chloroethyl, bromoethyl, chloropropyl, chlorobutyl, chlorohexyl, chlorooctyl, hydroxymethyl, hydroxyethyl, hydroxypropyl, hydroxybutyl, hydroxypentyl, hydroxyhexyl, hydroxyheptyl, aminomethyl, acetylaminomethyl, dimethylaminomethyl, aminoethyl, acetylaminoethyl, dimethylaminoethyl, diethlaminoethyl, morpholinoethyl, pyperidinoethyl, diethylaminopropyl; dipropylaminoethyl, aminopropyl, acetylaminopropyl, aminobutyl, and morpholinobutyl.

The aryl group represented by $R^8$, $R^9$, $R^{10}$ and $R^{11}$ includes, for example, phenyl, naphthyl, anthryl, and phenanthryl. The substituted aryl group includes, for example, tolyl, xylyl, cumenyl, mesityl, chlorophenyl, methoxyphenyl, and fluorophenyl.

The aralkyl group represented by $R^8$, $R^9$, $R^{10}$ and $R^{11}$ includes, for example, benzyl, phenethyl, benzhydryl, trityl, phenylpropyl, and naphthylmethyl. The substituted aralkyl group includes, for example, chlorobenzyl, dichlorobenzyl, methoxybenzyl, and methylbenzyl.

The cycloalkyl group represented by $R^8$, $R^9$, $R^{10}$, $R^{11}$, $a^1$ and $a^2$ includes, for example, a cycloalkyl group with a ring of 5, 6 or 7 members, which may be substituted with an alkyl group.

The alkoxyl group represented by $R^8$, $R^9$, $R^{10}$, $R^{11}$, $a^1$ and $a^2$ includes, for example, methoxy, ethoxy, propoxy, butoxy, i-propoxy, benzyloxy, and 2-phenylethoxy.

The substituted or unsubstituted amino group represented by $a^1$ and $a^2$ includes, for example, amino, acetylamino, methylamino, isopropylamino, dimethylamino, phenylamino, diethylamino, cyclopentylamino, cyclopentylmethylamino, cyclohexylamino, piperidino, and pyrrolidino.

Z represents a divalent group, and is exemplified by an alkylene group and an aralkylene group. Specifically, it preferably includes methylene, ethylidene, propylidene, benzylidene, cinnamylidene, p-hydroxybenzylidene, p-methylbenzylidene, and p-dimethylaminobenzylidene.

Of the compound represented by the above Formula (III), examples of particularly preferred compounds are set out below, but the reducing agent used in the present invention is by no means limited to these.

Examples of the compound represented by Formula (III) include 2-methyl-4-(3,5-dimethyl-4-hydroxyphenyl)methyl-1-naphthol, 2-methyl-4-(3,5-di-t-butyl-4-hydroxyphenyl)methyl-1-naphthol, 2-methyl-4-(hydroxyphenyl)methyl-1-naphthol, 2-methyl-4-p-tolylmethyl-1-naphthol, 2-methyl-4-benzyl-1-naphthol, 2-t-butyl-4-(4-hydroxyphenyl)methyl-1-naphthol, 2-methyl-4-(3,5-dichloro-4-hydroxyphenyl)methyl-1-naphthol, 2-ethyl-4-(3,5-di-t-butyl-4-hydroxyphenyl)methyl-1-naphthol, 2-methyl-4-(3,5-dimethoxy-4-hydroxyphenyl)methyl-1-naphthol, 2-methyl-4-(3-methyl-4-hydroxyphenyl)methyl-1-naphthol, 2-t-butyl-4-(3-t-butyl-4-hydroxyphenyl)methyl-1-naphthol, 2,6-di-t-butyl-4-α-naphthylmethylphenol, 2,6-di-t-butyl-4-methoxynaphthylmethylphenol, 2-methyl-4-(3-chloro-4-hydroxyphenyl)methyl-1-naphthol, 2-methyl-4-(4-dimethylaminophenyl)methyl-1-naphthol, 2-ethyl-4-diphenylmethyl-1-naphthol, 2-methyl-4-(3-cyclohexyl-4-hydroxyphenyl)-methyl-1-naphthol, 2-methyl-4-(3-phenyl-4-hydroxyphenyl)methyl-1-naphthol, 2-methyl-4-(3-t-butyl-4-hydroxy-5-methylphenyl)methyl-1-naphthol, and 2-methyl-4-benzyl-6-methyl-1-naphthol.

Of the above reducing agents of Formulas (I), (II) and (III), two or more ones may be used in combination.

In addition to the above reducing agents, leuco compounds of coloring matters that can be reduced can be used as the reducing agent that turns into the light-absorbing organic compound. Preferred leuco compounds include, those of, for example, azo dyes, azomethine dyes, triarylmethane dyes, xanthene dyes, azine dyes, indigoid dyes, formazan dyes, nitro dyes, nitroso dyes, and azoxy dyes. Particularly preferred are leuco compounds of azomethine dyes, triarylmethane dyes, xanthene dyes, azine dyes, and indigoid dyes. To further improve the stability of these leuco compounds, these can also be used in the form in which the hydroxyl group or amino group has been acylated or sulfonated. Preferred examples of the leuco compounds include, for example, α-benzoyl-α-(p-diethylaminoanilino)acetanilide, α-benzoyl-α-(p-diethylamino-o-methylanilino)aceto-o-chloroanilide, α-benzoyl-α-(p-dimethylaminoanilino)aceto-o-methoxyanilide, Crystal Violet Hydrol, 9-phenyl-2,7-dichloro-3,6-dihydroxyxanthene, 9-phenyl-2,4,5,7-tetrachloro-3,6-dihydroxyxanthene, 9-phenyl-4,5-dimethyl-3,6-dihydroxyxanthene, and 9-phenyl-3-diethylamino-6-hydroxy-7-chloroxanthene.

The reducing agent participating in the case that the oxidized product produced as a result of the oxidation-reduction reaction is further react with a coupler to produce the light-absorbing organic compound, may include, for example, secondary color developing agents. Preferred secondary color developing agents include, for example, p-aminophenols, p-phenylenediamines, and o-aminophenols.

Also usable as the secondary color developing agent are hydrazines as disclosed in Japanese Unexamined Patent Publication No. 56-27132, sulfonamidophenols as disclosed in U.S. Pat. No. 4,021,240, and also a compound capable of producing an aromatic primary amine as a result of heating, as disclosed in Japanese Unexamined Patent Publication No. 59-53831. Examples of the secondary color developing agent that can be preferably used in the present invention include 4-amino-N,N-diethylaniline, 2-amino-5-diethylaminotoluene, 4-amino-N,N-diethyl-3-(β-hydroxyethyl)aniline, 4-amino-N,N-bis(β-hydroxyethyl)-3-methylaniline, p-aminophenol, p-amino-o-cresol, o-aminophenol, and o-amino-p-cresol. These may be used as they are, or may be used in the form of salts such as a hydrochloride, a sulfate, a phosphate, a p-toluenesulfonate, a benzenesulfonate, and a naphthalenedisulfonate.

The coupler may preferably include α-acylacetamides, pyrazolones, phenols, and naphthols. These are described in "SHASHIN NO KAGAKU (Chemistry of Photography)", First Edition, Shashin Kogyo Shuppansha, pp. 278-282, or T. H. James, "The Theory of the Photographic Process", Fourth Edition, Macmillan Publishing Co., Inc., pp. 353-361.

Examples of the coupler include benzoylacetanilide, benzoylaceto-o-methoxyanilide, benzoylaceto-o-chloroanilide, 1-phenyl-3-(4'-nitrobenzamido)-5-pyrazolone, 1-phenyl-3-[m-(p-t-amylphenoxy)benzamido]-5-pyrazolone, 2-chloro-1-naphthol, and 5-isopropyl-o-cresol. Indazolones or cyanoacetyls can also be used as the coupler.

A reducing agent that does not turn into the light-absorbing organic compound as a result of the oxidation-reduction reaction may also be contained in the image forming medium of the present invention so long as the object of the present invention may not be hindered.

The reducing agent utilizable as the reducing agent that does not turn into the light-absorbing organic compound as a result of the oxidation-reduction reaction but can be contained in the image forming medium of the present invention includes, for example, phenols, hydroquinones, catechols, p-aminophenols, 3-pyrazolidones, resorcins, pyrogallols, m-aminophenols, m-phenylenediamines, 5-pyrazolones, alkylphenols, alkoxyphenols, naphthols, aminonaphthols, naphthalenediols, alkoxynaphthols, hydrazines, hydrazones, hydroxycuromane, hydroxycoumarans, sulfonamide phenols, aminonaphthols, ascorbic acids, hydroxyindanes, and orthobisphenols. Leuco bases obtained by reduction of coloring matters can also be used as the reducing agent.

The photopolymerization initiator used in the image forming medium of the present invention includes, for example, carbonyl compounds, sulfur compounds, halogen compounds, photopolymerization initiators of redox type, and peroxide initiators sensitized with a dye such as pyrylium.

Specifically, the carbonyl compounds include diketones as exemplified by benzyl, 4,4'-dimethoxybenzyl, diacetyl, and camphorquinone; benzophenones as exemplified by 4,4'-bis(diethylamino)benzophenone, and 4,4'-dimethoxylbenzophenone; acetophenones as exemplified by acetophenone, and 4-methoxyacetophenone; benzoin alkyl ethers; thioxanthones as exemplified by 2-chlorothioxanthone, 2,4-dichlorothioxanthone, 2,4-diethylthioxanthone, and thioxanthone-3-carboxylic acid-β-methoxy ethyl ester; chalcones and styrylketones having a dialkylamino group; and cumarines as exemplified by 3,3'-carbonylbis(7-methoxycumarine), and 3,3'-carbonylbis(7-diethylaminocumarine).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to obtain a more efficient photopolymerization reaction.

Such combination of the photopolymerization initiators includes a combination of chalcones having a dialkylamino group and styrylketones or cumarins, with S-triazines having a trihalomethyl group or camphorquinone.

In the image forming medium of the present invention, preferably used are photopolymerization initiators having a photosensitive wavelength region of from 370 to 520 nm.

In the present invention, the photopolymerization initiator to be used is required to be appropriately selected depending on the light-absorption characteristics of the light-absorbing organic compound produced as a result of the oxidation-reduction reaction of the reducing agent. Examples of such combination of the reducing agent and photopolymerization initiator are set out below.

When, for example, 4,4'-propylidenebis(2,6-di-t-butylphenol), 4,4'-butylidenebis(3-methyl-6-t-butylphenol), 4,4'-methylenebis(2,6-di-t-butylphenol), 4,4'-methylenebis(2-t-butyl-6-methylphenol), 2,6-di-t-butyl-4-(3,5-dimethyl-4-hydroxyphenyl)methylphenol, 2-methyl-4-(3,5-dimethyl-4-hydroxyphenyl)methyl-1-naphthol, etc. are used as the reducing agent, preferred are photopolymerization initiators having sensitivity at 380 mm to 420 mm, as exemplified by 2-chlorothioxanthone, 2-methylthioxanthone, 2,4-dimethylthioxanthone, 2,4-diethylthioxanthone, 3,3'-carbonylbis(7-methoxycumarine), 2,4,6-trimethylbenzoyldiphenylphosphine oxide, and benzyl.

When, for example, 2,6-di-t-butyl-4-(2-hydroxy-3-t-butyl-5-methylbenzyl)phenol, 2,6-di-t-butyl-4-benzylphenol, 2,6-di-t-butyl-4-o-trimethylphenol, etc. are used as the reducing agent, preferred are photopolymerization initiators having sensitivity at 300 mm to 380 mm, as exemplified by 1-phenyl-2-hydroxy-2-methylpropane-1-one, 1-hydroxycyclohexyl phenyl ketone, benzyl dimethyl ketal, benzophenone, and 4-benzoyl-4'-methyl-diphenyl sulfide.

When, for example, bis(3,5-di-t-butyl-4-hydroxyphenyl)-(4-dimethylaminophenyl)methane, 4,4'-methylenebis(2-methyl-1-naphthol), 4,4'-methylenebis(2-ethyl-1-naphthol), 4,4'-methylenebis(2-cyclohexyl-1-naphthol), 4,4'-methylenebis(2-t-butyl-1-naphthol), etc. are used as the reducing agent, preferred are combinations of photopolymerization initiators having sensitivity at 400 mm to 520 mm, as exemplified by 3,3'-carbonylbis(7-dimethylaminocumarine), riboflavin tetrabutylate, or merocyanine dyes, with trichloromethyl-S-triazine compounds.

As the polymerizable polymer precursor used in the image forming medium of the present invention, a compound having at least one reactive vinyl group in its one molecule can be utilized.

The reactive vinyl group in these compounds includes substituted or unsubstituted vinyl groups having polymerization reactivity, as exemplified by styrene type vinyl groups, acrylic acid vinyl type groups, methacrylic acid type vinyl groups, allyl type vinyl groups, and vinyl ethers, as well as ester vinyl groups such as vinyl acetate.

Examples of the polymerizable polymer precursor satisfying such conditions are as follows.

They include, for example;

monovalent monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether;

divalent monomers such as divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α,α'-dichloroglutarate, distyryl terephthalate, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4- phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), $\beta,\beta'$-dimethylglutaric acid di(ethyl methacrylate), 1,4-phenylenebis(oxyethyl methacrylate), and 1,4-bis(methacryloyloxyethoxy)cyclohexane acryloyloxyethoxyethyl vinyl ether;

trivalent monomers such as pentaerythritol triacrylate, pentaerythritol trimethacrylate, pentaerythritol tri(hydroxystyrene), cyanuric acid triacrylate, cyarnuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethylacrylate), dipentaerythritol hexaacrylate, cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product between 1,1,1-trimethylolpropane and three-fold moles of hexanediisocyanate, with p-hydroxystyrene; and tetravalent monomers such as ethylene-tetraacrylamide, and propylenetetraacrylamide. Two or more of these polymerizable polymer precursors may be used in combination.

For the purpose of improving film formation properties and dispersion, the image forming layer 1 may preferably be incorporated with a binder, which may be appropriately contained.

The binder includes, for example;
  cellulose esters such as nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate;
  cellulose ethers such as methyl cellulose, ethyl cellulose, propyl cellulose, and butyl cellulose;
  vinyl resins such as polystyrene, polyvinyl chloride, polyvinyl acetate, polyvinyl butyral, polyvinyl acetal, polyvinyl alcohol, and polyvinyl pyrrolidone;
  copolymer resins such as a styrene/butadiene copolymer, a styrene/acrylonitrile copolymer, a styrene/butadiene/acrylonitrile copolymer, and a vinyl chloride/vinyl acetate copolymer;
  acrylic resins such as polymethyl methacrylate, polymethyl acrylate, polybutyl acrylate, polyacrylic acid, polymethacrylic acid, polyacrylamide, and polyacrylonitrile;
  polyesters such as polyethylene terephthalate;
  polyacrylate resins such as poly(4,4'-isopropylidene,-diphenylene-co-1,4-cyclohexylenedimethylene carbonate), poly(ethylenedioxy-3,3'-phenylene thiocarbonate), poly(4,4'-isopropylidene,diphenylene carbonate-coterephthalate), poly(4,4'-isopropylidene,diphenylene carbonate), poly(4,4'-sec-butylidene,diphenylene carbonate), and poly(4,4'-isopropylidene,diphenylene carbonate-block-oxyethylene);
  polyamides; polyimides; epoxy resins; phenol resins; polyolefins such as polyethylene, polypropylene, and chlorinated polyethylene; and
  natural polymers such as gelatin.

In addition to these, toning agents, antifoggants, alkali generating agents, automatic oxidants, etc. may be optionally added in the image forming medium of the present invention. The image forming layer 1 may also be provided with a protective layer comprising polyvinyl alcohol, polyethylene terephthalate or the like so that the polymerization reaction can be prevented from its inhibition due to oxygen and any damages ascribable to an external force can be prevented.

In the image forming medium of the present invention, the components described above may preferably be used in the proportion as follows:

The organic silver salt may preferably be contained in the image forming layer 1 in an amount of from 0.3 to 30 g/m$^2$, more preferably from 0.7 to 15 g/m$^2$, and particularly preferably from 1.2 to 8 g/m$^2$.

The silver halide is preferably contained in an amount of from 0.001 mole to 2 moles, more preferably from 0.05 mole to 1 mole, and still more preferably from 0.05 mole to 0.4 mole, per 1 mole of the organic silver salt. The reducing agent is preferably contained in an amount of from 0.05 mole to 3 moles, and more preferably from 0.2 mole to 1.3 mole, per 1 mole of the organic silver salt. The polymerization initiator is preferably contained in an amount of from 0.1 part by weight to 30 parts by weight, and more preferably from 0.5 part by weight to 10 parts by weight, based on 100 parts by weight of the polymerizable polymer precursor. The polymerization initiator is preferably contained in an amount of from 0.01 mole to 10 moles, and more preferably from 0.5 mole to 3 moles, per 1 mole of the reducing agent.

The amount of the binder optionally contained in the image forming layer 1 may preferably be contained in a proportion of from 0 to 10 parts by weight, and more preferably from 0.5 to 5 parts by weight, based on 1 part by weight of the organic silver salt. This proportion also applies in respect of the photosensitive layer 11 described later. The amount of the binder also optionally contained in the polymerizing layer 12 described later may preferably be contained in a proportion of from 0 to 10 parts by weight based on 1 part by weight of the polymerizable polymer precursor.

The image forming medium of the present invention can be formed by dissolving the above components in a solvent together with a binder appropriately used, and coating the resulting solution on the support 2 such as metal foil, plastic film, paper, baryta paper or synthetic paper, followed by drying, or, when the strength is kept by the binder itself, by incorporating the above essential components into a film- or sheet-like material formed by the binder.

The image forming layer 1 may preferably have a thickness of from 0.1 μm to 2 mm, and more preferably from 1 μm to 0.1 mm. The support 2 may also preferably have a thickness of from about 2 μm to about 3 mm.

Figure 9:
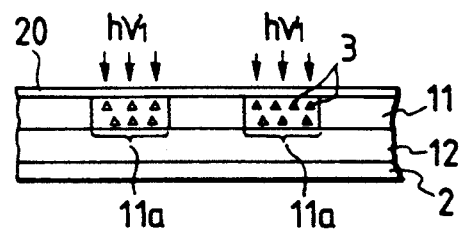
FIGS. 9 to 11 are side views to illustrate another example of the step of imagewise exposure, the step of heating and the step of polymerization, respectively, of the present invention.

The image forming layer 1 may be constituted of a multi-layer structure. For example, as shown in FIG. 9, the image forming layer 1 may be constituted of a photosensitive layer 11 and a polymerizing layer 12, and provided on the support 2. In this instance, the photosensitive layer 11 contains at least the photosensitive silver halide, organic silver salt and reducing agent, and the polymerizing layer 12 contains at least the polymerizable polymer precursor and photopolymerization initiator. The numeral 20 denotes a protective layer comprising polyvinyl alcohol, polyethylene terephthalate or the like, which may be optionally provided.

In instances in which an image is formed using the image forming medium comprised of the image forming layer having the multi-layer constitution, the image is formed according to the same method as described in relation to FIGS. 1 to 3. First, as shown in FIG. 9, in the step of imagewise exposure the photosensitive layer 11 is imagewise exposed to light in the desired form according to analog exposure or digital exposure (hv1). As a result, silver metal 3 is produced on the photosensitive silver halide in the exposed area 11a. This forms a latent image. The silver metal 3 produced serves as a catalyst for the thermal reaction between the organic silver salt and reducing agent contained in the photosensitive layer 11.

Figure 10:
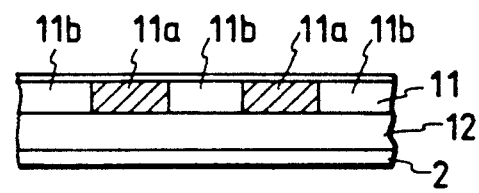

Next, in the step of heat development, the photosensitive layer 11 in which the latent image has been formed is heated. As a result, as shown in FIG. 10, the silver metal 3 selectively acts as a catalyst at the exposed area 11a, and the organic silver salt reacts with the reducing agent, where the organic silver salt is reduced to a silver atom and at the same time the reducing agent is formed into an oxidized product.

Heating conditions in this step of heat development are the same as the instance described in relation to FIGS. 1 to 3.

Figure 11:
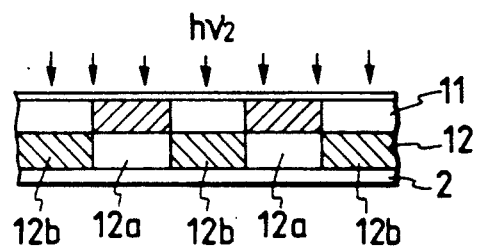

Subsequently, as shown in FIG. 11, in the step of polymerization, polymerization exposure is carried out on the whole surface from the photosensitive layer 11 side (hv2) to bring the photopolymerization initiator contained in the polymerizing layer 12 into cleavage to generate a radical species. This radical species causes polymerization reaction, and thus a polymer area is formed in the polymerizing layer 12. On that occasion, the amount of transmission of the light of the wavelength region which the photopolymerization initiator absorbs is different between the exposed area 11a and unexposed area 11b, and hence a difference is produced in the state of formation of polymers, between the part 12a corresponding to the exposed area 11a and the part 12b corresponding to the unexposed area 11b, of the polymerizing layer 12 (resulting in a higher degree of polymerization at the part 12b corresponding to the unexposed area 11b than the part 12a corresponding to the exposed area 11a). A polymer image is thus formed because of this difference.

Figure 12:
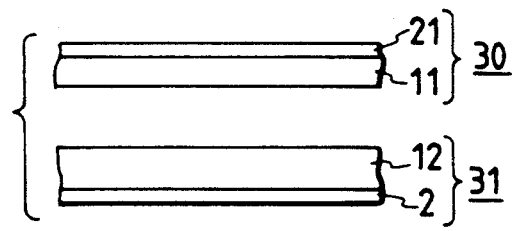
FIG. 12 is a side view to illustrate an example of the photosensitive material and polymerization material used in the separation process according to the present invention.

An image can be formed also when, as shown in FIG. 12, a photosensitive material 30 and a polymerization material 31 are used which comprise the photosensitive layer 11 and polymerizing layer 12 separately provided on a support 21 and on a support 2, respectively. More specifically, first the photosensitive layer 11 of the photosensitive material 30 is subjected to the step of imagewise exposure and step of heating previously described, and then the photosensitive layer 11 and the polymerizing layer 12 of the polymerization material 31 are laid overlapping each other and subjected to the step of polymerization previously described. The polymer image can be thus formed (Separation process).

The components that constitute the photosensitive layer 11 and polymerizing layer 12 shown in FIGS. 9 and 12, and the mixing proportion of the components can be made similar to the instance of the image forming medium constituted of the single layer image forming layer (FIG. 1). The support 21 may also be made of the same material as the support 2, and there can be used, for example, metallic foil, plastic film, paper, baryta paper, or synthetic paper.

When the image forming layer (having the photosensitive layer 11 and polymerizing layer 12) shown in FIG. 9 and the photosensitive layer 11 and polymerizing layer 12 shown in FIG. 12 can respectively keep their shapes as layers by their own strength (for example, the binder is used), the support 2 and the support 12 may not be used.

The photosensitive layer 11 and polymerizing layer 12 each may preferably have a thickness of from 0.05 $\mu$m to 1 mm, more preferably from 0.3 $\mu$m to 30 $\mu$m, and particularly preferably from 0.6 $\mu$m to 10 $\mu$m.

In the image forming method of the present invention, an image may be further formed in the following way, utilizing the polymer image.

For example, a heat-diffusible coloring matter is previously incorporated in the image forming layer 1 shown in FIG. 1 or the polymerizing layer 12 shown in FIGS. 9 and 12, and the heat-diffusible coloring matter is transferred to an image receiving medium according to the step of transfer as described below to form an image.

Figure 13:
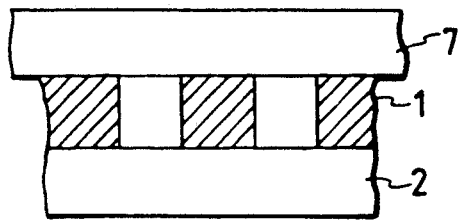
FIG. 13 is a side view to illustrate an example of the step of transferring the heat-diffusible coloring matter in the image forming method of the present invention.

Namely, as shown in FIG. 13, an image receiving medium 7 is laminated on the image forming layer 1 in which the polymer image has been formed, followed by heating. As a result, the heat-diffusible coloring matter the image forming medium previously contains is diffusion-transferred to the image receiving medium 7, corresponding with the latent image, and thus an image comprised of the heat-diffusible coloring matter is formed on the image receiving medium (Transfer step).

The image formation according to the above transfer step, in which the amount of transfer of the heat-diffusible coloring matter can be controlled according to the degree of polymerization (the amount of transfer of the heat-diffusible coloring matter decreases as the degree of polymerization increases), makes it possible to readily obtain an image with density gradation.

Figure 14:
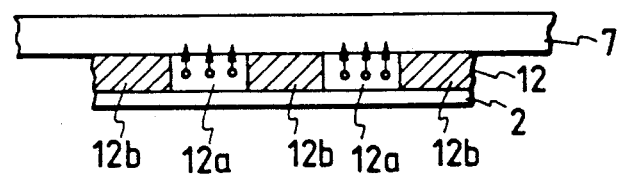
FIG. 14 is a side view to illustrate an example of the step of transferring the heat-diffusible coloring matter contained in a polymerizing layer in the image forming method of the present invention.

In the instance where the image forming layer has the photosensitive layer 11 and polymerizing layer 12 (FIG. 9) and the instance of the separation process, the image receiving medium 7 is, as shown in FIG. 14, laminated on the polymerizing layer 12 after the step of polymerization has been completed (provided that, in the instance of the image forming medium shown in FIG. 9, after the step of polymerization has been completed and the photosensitive layer 11 has been peeled), followed by heating to an appropriate degree. As a result of the heating, the heat-diffusible coloring matter present at the part 12a having a low degree of polymerization in the polymerizing layer 12 is selectively diffusion-transferred, since the heat-diffusibility of the heat-diffusible coloring matter present at the part 12b having a high degree of polymerization is suppressed in the polymerizing layer 12, compared with the heat-diffusible coloring matter present at the part 12a having a low degree of polymerization.

In the instance of the image forming medium shown in FIG. 9 and the instance of the separation process, the polymerizing layer 12 and image receiving medium 7 are directly laminated after the photosensitive layer 11 has been removed, but it is also possible to carry out the thermal transfer of the heat-diffusible coloring matter in the state that the photosensitive layer 11 is provided.

When the photosensitive layer 11 is removed, the binder used in the photosensitive layer 11 should be a binder that enables easy peeling of the photosensitive layer 11 from the polymerizing layer 12.

The mechanism by which the diffusibility of the heat-diffusible coloring matter in the polymerized area 12b is that the molecular chain of the polymer can be loosened with difficulty even when the polymerized area 12b is heated, as a result of the polymerization of the polymerizable polymer precursor or, when a polyfunctional polymerizable polymer precursor is contained, as a result of the crosslinking thereof, and thus the heat-diffusible coloring matter is suppressed from being diffused.

In the instance where the image is formed using the heat-diffusible coloring matter, the heat-diffusible coloring matter may not be incorporated in the image forming layer 1 or polymerizing layer 12, and instead a coloring material layer containing the heat-diffusible coloring matter may be provided between the image forming layer 1 and support 2 or between the polymerizing layer 12 and support 2. The image attributable to the heat-diffusible coloring matter can also be thereby formed in the same way as the previously described.

Known as an image forming method in which a coloring matter is transferred using a dry, silver salt type image forming medium is a method utilizing a reducing agent to which the function of generating a coloring matter is imparted. This known method, however, involves the disadvantage that the resulting image has so poor light-resistance and storage stability that laminating must be carried out or an ultraviolet absorbent must be used in a large amount.

On the other hand, according to the embodiment of the present invention, having the above transfer step, the reducing agent and the coloring matter are separate components, and hence the coloring matter can be arbitrarily selected, so that an image having light-resistance, storage stability and good tone can be obtained.

The heat-diffusible coloring matter may be contained in an amount of from 5 to 200 parts by weight, and more preferably from 10 to 100 parts by weight, based on 100 parts by weight of the total sum of the silver halide, organic silver salt, reducing agent, polymerizable polymer precursor, photopolymerization initiator and the binder optionally contained.

In the instance where the heat-diffusible coloring matter is contained in the polymerizing layer 12, the heat-diffusible coloring matter may suitably be contained in an amount of from 5 to 60% by weight based on the polymerizing layer 12. In the instance where the coloring material layer is provided, the heat-diffusible coloring matter may preferably be contained in an amount not less than 5% based on the coloring material layer. The coloring material layer can also be constituted of only the heat-diffusible coloring matter.

The heat-diffusible coloring matter used in the present invention includes, for example, monoazo dyes, thiazole dyes, anthraquinone dyes, triallylmethane dyes, rhodamine dyes, and naphthol dyes. The heat-diffusible coloring matter, in general, has a larger heat-diffusibility as the molecular weight becomes smaller, and also has a smaller heat-diffusibility as the dye has more polar groups as exemplified by a carboxyl group, an amino group, a hydroxyl group, a nitro group and a sulfone group. Hence, coloring matters having the desired heat-diffusibility may be appropriately selected on the basis of the molecular weight and polar groups, depending on the degree of polymerization or crosslink density and heating conditions in the image forming medium of the present invention.

There are no particular limitations on the image receiving medium used in the step of transferring the heat-diffusible coloring matter, so long as it enables good transfer of the heat-diffusible coloring matter and is capable of forming a good image. It may be a plain paper, but preferably be comprised of a substrate provided thereon with an image receiving layer so that the heat-diffusible coloring matter may be transferred to this image receiving layer. As the image receiving layer, various materials can be used, as exemplified by polyester resins, polycarbonate resins, polyvinyl acetate resins, polyurethane resins, polyamide resins, polycaprolactam resins, and polyvinyl chloride resins.

Preferred values for the heating temperature in the transfer step may vary depending on various conditions such as the type of the heat-diffusible coloring matter and the degree of polymerization of the polymer, but may range from 80° to 250° C., and preferably from 80° to 200° C.

Figure 15:
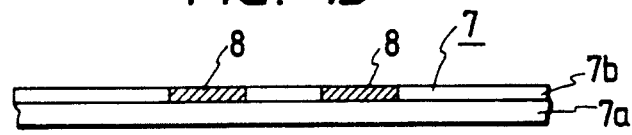
FIG. 15 is a side view to illustrate an example of an image receiving medium to which the heat-diffusible coloring matter has been transferred.

After the above transfer step, the image forming medium may be peeled from the image receiving medium. Thus, the heat-diffusible coloring matter is transferred to the image receiving medium 7 and an image 8 can be obtained on an image receiving layer 7b on a substrate 7a as shown in FIG. 15. The image obtained through the transfer step is an image having a superior contrast to give an image having a superior brightness and chroma.

In the present invention, in the instance where the image is formed using the heat-diffusible coloring matter, a plurality of image forming mediums (or polymerization materials) containing heat-diffusible coloring matters having colors different from each other as, e.g., yellow, magenta, cyan, and also black, may be used to form images with the respective colors, overlapping on a single image receiving medium, whereby an image with multiple colors can also be formed. Such an image with multiple colors can also be formed by an image forming medium (or a polymerization material) comprising a single support having thereon an image receiving layer (or a polymerizing layer, or a coloring material layer) containing heat-diffusible coloring matters with different colors (for example, yellow, magenta, cyan, and also black) in the state separated into regions for the respective colors. Namely, the heat-diffusible coloring matters may be successively transferred from the required color regions and the images with the respective colors may be overlapped each other, so that the image with multiple colors can be formed.

The polymer image can also be separated to the image receiving medium side and support side, utilizing the difference in adhesion between the area sufficiently polymerized and the area at which no polymerization has proceeded (Peeling-apart).

Figure 16:
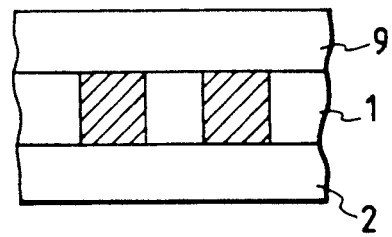
FIG. 16 is a side view to illustrate an example of the state in which the polymerizing step has been completed in the peeling-apart according to the present invention.
Figure 17:
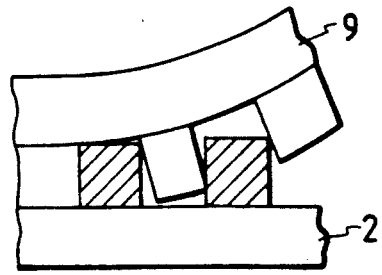
FIG. 17 is a side view to illustrate an example of the step of peeling the image receiving medium in the peeling-apart according to the present invention.

In this instance, an image forming medium comprising an image receiving medium 9 laminated on an image forming layer 1 is used, where, after the step of polymerization has been completed (FIG. 16), the image receiving medium 9 is peeled from the image forming medium (FIG. 17). As a result, the polymer image is separated at the area sufficiently polymerized and the area at which no polymerization has proceeded, and thus a positive image and a negative image can be obtained.

In the instance where the peeling-apart is carried out in the separation process, the area sufficiently polymerized and the area at which no polymerization has proceeded are separated when the photosensitive material 30 is peeled from the polymerization material 31.

In the above peeling-apart, whether or not the area sufficiently polymerized and the area at which no polymerization has proceeded are separated when the photosensitive material 30 is peeled from the polymerization material 31 depends on how the materials for the image receiving medium, support, image forming layer, etc. are selected.

The image receiving medium 9 used in the peeling-apart includes, for example, art paper, coated paper, films, and metallic foil. In the step of carrying out the peeling-apart, heating may not necessarily be required, but the image forming medium and image receiving medium may preferably be heated to about 40° C. to about 150° C. to carry out the transfer. The transfer may preferably be carried out under a pressure of from 0.5 kg/cm² to 400 kg/cm², and preferably from 1 kg/cm² to 150 kg/cm².

To note only the peeling-apart, such steps are disclosed in Japanese Patent Publication No. 38-9663, Japanese Unexamined Patent Publication No. 49-32640, etc.

The method of the present invention, however, can be said to be a superior method to the methods disclosed in these, on account of the photosensitivity, the photosensitivity wavelength region, and the fact that image processing is possible.

The polymer image may further be colored by selectively adhering a powder such as toner, or an ink, to the polymer image, utilizing the difference in adhesion or the difference in hydrophilic nature (or hydrophobic nature) between the polymerized area and unpolymerized area of the polymer image. The powder such as toner, or the ink, adhered to the polymer image may further be transferred to an image receiving medium such as paper. The unpolymerized area of the polymer image may also be removed by etching to give an image comprised of the polymerized area.

EXAMPLES

The present invention will be described below in greater detail by giving Example. In the following description, the "part(s)" that represents an amount proportion is by weight unless particularly mentioned.

EXAMPLE 1

Using a homomixer, a dispersion having the following composition was prepared in a darkroom.

| | |
|---|---|
| Behenic acid | 2.5 parts |
| Silver behenate | 4.5 parts |
| Silver bromide | 0.7 part |
| Polyvinyl butyral (S-LEC BL-1; a product of Sekisui Chemical Co., Ltd.) | 10.0 parts |
| Trimethylolpropane triacrylate (NK Ester A-TMPT; a product of Shin-Nakamura Chemical Co., Ltd.) | 10.0 parts |
| Ethyl 4-dimethylaminobenzoate (KAYACURE EPA; a product of Nippon Kayaku Co., Ltd.) | 0.6 part |
| 2,4-Diethylthioxanthone (KAYACURE DETX; a product of Nippon Kayaku Co., Ltd.) | 0.4 part |
| 4,4'-Methylenebis(2,6-di-t-butylphenol) | 3.2 parts |
| Phthalazinone | 0.8 part |
| Xylene | 60 parts |
| n-Butanol | 60 parts |

This dispersion was coated on a polyethylene terephthalate film (hereinafter "PET film") so as to give a dried film thickness of 5 μm. Subsequently, on the resulting coating, a polyvinyl alcohol layer (hereinafter "PVA layer") was further formed by coating to obtain an image forming medium of the present invention.

In respect of this image forming medium, $f(\lambda)$ and $g(\lambda)$ as shown in FIGS. 4 and 5 were measured according to the measuring method as previously described, to examine the O.D values $A_2$, $A_3$ and $A_4$, the absorption peak wavelengths $\lambda_3$ and $\lambda_6$, the halfwidth $W_{\frac{1}{2}}$, $a = |\lambda_6 - \lambda_3|/W_{178}$ and $k = G(\lambda_3)/(A_2 - A_4)$. Results obtained are shown in Table 1.

The image forming medium of the present Example, on which a mask was laid overlapping, was further imagewise exposed to light for 10 seconds through a filter that does not pass the light of 400 nm or less, using an ultra-high-pressure mercury lamp having an electric power of 500 W, with a distance of 60 cm from the medium. The mask was thereafter removed, and the medium was heated for 16 seconds using a heat-developing machine regulated at 125° C.

Thereafter, the filter was removed, and the polymerization exposure was carried out for 5 seconds using the above ultra-high-pressure mercury lamp with a distance of 60 cm from the medium, to form a polymer image. Subsequently, the PVA layer was removed by washing with water, followed by etching with ethanol. As a result, the polymerized area of the polymer image remained on the PET film. In the present Example, it was also possible to obtain the image by etching, even when the exposure time for the polymerization exposure was varied within the range of from 2 seconds to 50 seconds.

EXAMPLE 2

A dispersion having the following composition was prepared in a darkroom.

| | |
|---|---|
| Palmitic acid | 1.6 parts |
| Behenic acid | 0.4 part |
| Silver behenate | 4.0 parts |
| Silver iodobromide | 0.9 part |
| Methyl methacrylate/styrene (8/2) copolymer | 12.0 parts |
| Trimethylolpropane triacrylate (NK Ester A-TMPT; a product of Shin-Nakamura Chemical Co., Ltd.) | 4.0 parts |
| Dipentaerythritol hexaacrylate (KAYARD DPHA; a product of Nippon Kayaku Co., Ltd.) | 6.5 parts |
| p-Diethylaminobenzonitrile | 0.2 part |
| Benzyl dimethyl ketal (Irgacure 651; a product of Ciba Geigy Corp.) | 0.3 part |
| α-(3,5-di-t-butyl-4-hydroxyphenyl)-α-phenylethane | 2.8 parts |
| Phthalazinone | 0.7 part |
| Toluene | 80 parts |
| i-Propanol | 40 parts |

This dispersion was coated on a PET film so as to give a dried film thickness of 8 μm. Subsequently, the resulting coating was laminated on an anodized aluminum sheet to obtain an image forming medium of the present invention.

In respect of this image forming medium, $f(\lambda)$ and $g(\lambda)$ were measured according to the measuring method as previously described, in the state that no lamination has been made on the aluminum sheet. Results obtained are shown in Table 1.

The image forming medium of the present Example was further imagewise exposed to light in the same manner as Example 1. Thereafter, the medium was heated for 8 seconds using a heat-developing machine regulated at 130° C.

Thereafter, the filter was removed, and the polymerization exposure was carried out for 10 seconds using the same ultra-high-pressure mercury lamp as used in the imagewise exposure, with a distance of 60 cm from the medium, to form a polymer image. Subsequently, the PET laminate film was removed, followed by etching with an ethanol/acetone mixed solution. As a result, the polymerized area of the polymer image remained on the aluminum sheet film. In the present Example, it was also possible to obtain the image by etching, even when the exposure time for the polymerization exposure was varied within the range of from 3 seconds to 20 seconds.

Example 3

A dispersion having the following composition was prepared in a darkroom.

| | |
|---|---|
| Behenic acid | 2.5 parts |
| Silver behenate | 4.5 parts |
| Silver bromide | 0.7 part |
| Polymethyl methacrylate (Dianal BR-100; a product of Mitsubishi Rayon Co., Ltd.) | 10.0 parts |
| Dipentaerythritol hexaacrylate (KAYARD DPHA; a product of Nippon Kayaku Co., Ltd.) | 10.0 parts |
| Ethyl 4-dimethylaminobenzoate (KAYACURE EPA, a product of Nippon Kayaku Co., Ltd.) | 0.6 part |
| Phthalazinone | 0.8 part |
| 2,4-Diethylthioxanthone (KAYACURE DETX; a product of Nippon Kayaku Co., Ltd.) | 0.4 part |
| 4,4'-Methylenebis(2,6-di-t-butylphenol) | 4.2 parts |
| MS Magenta VP (a product of Mitsui Toatsu Chemicals Inc.) | 2.0 parts |
| Toluene | 80 parts |
| i-Propanol | 40 parts |

This dispersion was coated on a PET film so as to give a dried film thickness of 5 μm. Subsequently, on the resulting coating, a PVA layer was further formed by coating to obtain an image forming medium of the present invention.

In respect of this image forming medium, $f(\lambda)$ and $g(\lambda)$ were measured according to the measuring method as previously described. Results obtained are shown in Table 1.

The image forming medium of the present Example was further imagewise exposed to light and subjected to the heat development in the same manner as Example 1.

Thereafter, the filter was removed, and, while heating the medium at 80° C., the polymerization exposure was carried out for 30 seconds using the same ultra-high-pressure mercury lamp as used in the imagewise exposure, with a distance of 60 cm from the medium, to form a polymer image. Subsequently, the PVA layer was removed by washing with water, and then the exposed surface of the image forming medium and an image receiving paper coated with polyester resin were laid overlapping each other, which were then passed through a 100° C. transfer roller. Thereafter the image receiving paper was peeled from the image forming medium. As a result, a sharp red image corresponding with the imagewise exposed area was formed on the image receiving paper.

EXAMPLE 4

Example 1 was repeated to prepare an image forming medium of the present invention, except that 2.5 parts of 4,4'-methylenebis(2-t-butyl-6-methylphenol) was used in place of the reducing agent 4,4'-methylenebis(2,6-di-t-butylphenol) in Example 1.

In respect of this image forming medium, $f(\lambda)$ and $g(\lambda)$ were measured according to the measuring method as previously described. Results obtained are shown in Table 1.

The image forming medium of the present invention was further subjected to formation of a polymer image in the same manner as Example 1, followed by etching with ethanol. As a result, the polymerized area of the polymer image remained on the PET film. In the present Example, it was also possible to obtain the image by etching, even when the exposure time for the polymerization exposure was varied within the range of from 3 seconds to 15 seconds.

EXAMPLE 5

A solution obtained by dissolving 1.2 mg of a sensitizing dye represented by the following formula, in 1.0 ml of N,N-dimethylformamide was added in the dispersion prepared in the same manner as Example 1.

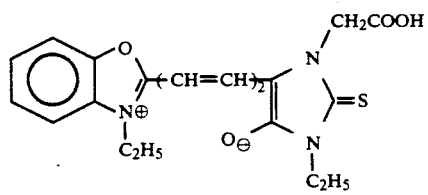

Subsequently, the resulting dispersion was coated on a PET film so as to give a dried film thickness of 5 μm. On the resulting coating, a PVA layer was further formed by coating to obtain an image forming medium of the present invention.

On this image forming medium, image writing was carried out with a He-Ne laser (wavelength: 633 nm; output: 5 mW), using a drum-scanning laser beam printer (LBPP, manufactured by Abe Sekkei). Thereafter, the heat development and polymerization exposure were carried out in the same manner as Example 1. Subsequently, the PVA layer was removed by washing with water, followed by etching with ethanol. As a result, there was obtained an image corresponding with the irradiation with laser beams.

EXAMPLE 6

| | |
|---|---|
| Behenic acid | 4 parts |
| AgBr | 1.2 parts |
| Silver behenate | 7 parts |
| Polyvinyl butyral (S-LEC BL-2; a product of Sekisui Chemical Co., Ltd.) | 10 parts |
| Phthalazinone | 0.6 part |
| Toluene-butanol | 120 parts |
| 2,6-Diethyl-4-(3-cyclohexyl-4-hydroxy-5-methylbenzyl)phenol | 2.5 parts |

-continued

| | |
|---|---|
| The above formulation was weighed, which was set in an ultrasonic dispersion machine and uniformly dispersed to obtain Solution A. | |
| Oplas Red 330 (a product of Orient Chemical Industries Ltd.) | 1.8 parts |
| Methyl methacrylate/butyl methacrylate (8/2) copolymer | 1.0 part |
| Methyl ethyl ketone | 10 parts |
| 3,3'-Carbonylbis(7-methoxycumarine | 0.16 part |
| Ethyl p-dimethylaminobenzoate (KAYACURE EPA; a product of Nippon Kayaku Co., Ltd.) | 0.04 part |
| Pentaerythritol tetraacrylate | 2.0 parts |

The above formulation was weighed, and dissolved using a paint shaker to obtain Solution B.

On a 6 μm thick polyester film, Solution B was coated using an applicator so as to give a dried film thickness of 2 μm. A polymerizing layer was thus provided.

Next, on the polymerizing layer, Solution A was coated using an applicator so as to give a dried film thickness of 2 μm. A photosensitive layer was thus provided.

On the photosensitive layer, a 3 μm thick PVA layer was further provided to obtain an image forming medium of the present invention.

In respect of this image forming medium, $f(\lambda)$ and $g(\lambda)$ were measured according to the measuring method as previously described. Results obtained are shown in Table 1.

A mask was fitted to the PVA layer of the image forming medium of the present Example, and the resulting medium was imagewise exposed to light to form a latent image.

Used as a light source was a 10 W fluorescent lamp having a peak wavelength at 390 nm, and the exposure was carried out for 1 second with a distance of 5 cm from the image forming medium.

The mask was thereafter removed, and the medium was heated for 8 seconds using a heat-developing machine regulated at 110° C. At this time, the optical density at the absorption peak of the photosensitive layer was 3.30.

The resulting image forming medium was placed on a hot plate heated to 60° C., which was irradiated for 60 seconds with light of a 10 W fluorescent lamp having a fluorescent peak at 390 nm, with a distance from 5 cm from the medium, to form a polymer image.

Subsequently, the PVA film and photosensitive layer were removed. Using as an image receiving medium a synthetic paper on which an image receiving layer was formed with polyester resin, the polymerizing layer and image receiving layer were laid overlapping each other, followed by heating from the image forming medium side under conditions of 120° C. and 10 seconds. As a result, the dye was diffusion-transferred from the polymerizing layer to the image receiving layer, and a sharp red image corresponding with the imagewise exposed area was obtained on the image receiving paper.

EXAMPLE 7

Example 6 was repeated to prepare an image forming medium of the present invention, except that 5 parts of silver benzotriazole and 2 parts of guanidine trichloromethylacetate were used in place of the silver behenate in Example 6.

The medium was imagewise exposed to light in the same manner as Example 6, followed by heating for 20seconds using a heat-developing machine regulated at 120° C. Subsequently, the polymerization exposure and the subsequent procedures were carried out in the same manner as Example 6. As a result, a sharp red image was obtained on the image receiving paper.

EXAMPLE 8

In 10 parts of toluene/iso-propanol (1:1), 0.2 part of AgBrI, 0.5 part of silver behenate, 0.4 part of behenic acid and 0.4 part of 2,6-di-t-butyl-4-o-tolylmethylphenol were dispersed and dissolved to make Solution C.

Apart therefrom, 1.0 part of polymethyl methacrylate and 2.0 parts of Oil Scarlet 308 (trade name; a product of Chuo Gosei Chemical) were dissolved in 10 parts of methyl ethyl ketone to make Solution D.

In addition, 1.0 part of polymethyl methacrylate and 2.7 parts of epoxyacrylate (trade name: V5502; a product of Dainippon Ink & Chemicals, Incorporated) and 0.26 part of benzyl dimethyl ketal were dissolved in 10 parts of methyl ethyl ketone to make Solution E.

Subsequently, on a 6 μm thick PET film having been subjected to heat-resistance treatment, Solution D was coated using an applicator so as to give a dried film thickness of 2 μm to form a coloring material layer. Solution E was further coated on this coloring material layer so as to give a dried film thickness of 2 μm to provide a polymerizing layer.

Next, on this polymerizing layer, Solution C was coated using an applicator so as to give a dried film thickness of 2 μm to provide a photosensitive layer. On this photosensitive layer, a PVA layer with a thickness of 3 μm was further provided. An image forming medium of the present invention was thus prepared.

In respect of this image forming medium, $f(\lambda)$ and $g(\lambda)$ were measured according to the measuring method as previously described. Results obtained are shown in Table 1.

A mask was fitted to the PVA layer of the image forming medium of the present Example, and the resulting medium was imagewise exposed to light to form a latent image.

Used as a light source was a 10 W fluorescent lamp having a peak wavelength at 420 nm, and the exposure was carried out for 20 msec with a distance of 5 cm from the image forming medium.

The mask was thereafter removed, and the medium was heated for 20 seconds using a heat-developing machine regulated at 120° C.

The resulting image forming medium was irradiated on its whole surface for 5 seconds with light of a 10 W fluorescent lamp having a fluorescent peak at 335 nm, with a distance from 3 cm from the medium, to form a polymer image.

Subsequently, the PVA film and photosensitive layer were removed, and then the dye was transferred to an image receiving paper in the same manner as Example 6. As a result, a sharp red image was obtained.

EXAMPLE 9

In 10 parts of toluene/iso-propanol (1:1), 0.1 part of AgBr, 0.5 part of silver behenate, 0.4 part of behenic acid, 0.4 part of 2,6-di-t-butyl-4-(3,5-dimethyl-4-hydroxybenzyl)phenol, 0.2 part of phthalazinone and 1 part of polymethyl methacrylate were dispersed to make Solution F.

Apart therefrom, 1.0 part of polymethyl methacrylate, 2.0 parts of Unideck 16-824 (trade name; a product of Dainippon Ink & Chemicals, Incorporated), 0.2 part of 2,4-dichlorothioxanthone, 0.1 part of ethyl p-dimethylaminobenzoate and 0.2 part of Phorone Brilliant Scarlet SRL (a product of Sandoz Co.) were added in 10 parts of methyl ethyl ketone, and the mixture was dispersed using a paint shaker to make Solution G.

On an aluminum-deposited polyethylene terephthalate film (a product of Panac Kogyo Co.), the above Solution G was coated using an applicator so as to give a dried film thickness of 2 μm to obtain Film A. Solution F was subsequently coated on a transparent polyethylene terephthalate film, using an applicator so as to give a dried film thickness of 2 μm to obtain Film B. On the above Film A, Film B was laminated in the manner that their coatings may face each other. An image forming medium of the present invention was thus prepared.

In respect of this image forming medium, $f(\lambda)$ and $g(\lambda)$ were measured according to the measuring method as previously described. Results obtained are shown in Table 1.

A mask was fitted to the image forming medium thus prepared, and the resulting medium was imagewise exposed to light to form a latent image.

Used as a light source was a 10 W fluorescent lamp having a fluorescent peak at 390 nm, and the exposure was carried out for 2 seconds with a distance of 5 cm from the image forming medium.

The mask was thereafter removed, and the medium was heated for 10 seconds using a heat-developing machine regulated at 130° C.

The above image forming medium was further placed on a hot plate heated to 60° C., which was irradiated for 20 seconds with light of a 10 W fluorescent lamp having a fluorescent peak at 380 nm, with a distance from 5 cm from the image forming medium, to form a polymer image.

Film B was peeled while the above image forming medium was being passed through rollers heated at 60° under a pressure of 25 kg/cm². As a result, a red image was formed on the film.

EXAMPLE 10

Example 6 was repeated to prepare an image forming medium of the present invention, except that in Example 6 the 3,3'-carbonylbis(7-methoxycumarine) was increased from 0.16 part to 0.35 part so that $g(\lambda_2)=A_3$ may come to be 1.7.

Using this image forming medium, the image formation was carried out in the same manner as Example 6. As a result, a red image was obtained on the image receiving paper. The resulting dye image had a lower maximum optical density for red than that of the image obtained in Example 6, but caused no practical problems. The optical density at the absorption peak of the photosensitive layer was 3.36 after the imagewise exposure and heating were completed.

EXAMPLE 11

Using a homomixer, a dispersion having the following composition was prepared in a darkroom.

| | |
|---|---|
| Behenic acid | 2.5 parts |
| Silver behenate | 4.5 parts |
| Silver bromide | 0.7 part |
| Polyvinyl butyral (S-LEC BL-2; a product of Sekisui Chemical Co., Ltd.) | 10.0 parts |
| Trimethylolpropane triacrylate (NK Ester A-TMPT; a product of Shin-Nakamura Chemical Co., Ltd.) | 10.0 parts |
| Phthalazinone | 0.6 part |
| Ethyl 4-dimethylaminobenzoate | 0.6 part |
| 3,3'-Carbonylbis(7-diethylaminocumarine) | 0.6 part |
| Camphorquinone | 0.6 part |
| 4,4'-Methylenebis(2-methyl-1-naphthol) | 3.4 parts |
| Xylene | 60 parts |
| n-Butanol | 60 parts |

This dispersion was coated on a PET film so as to give a dried film thickness of 5 μm. Subsequently, on the resulting coating, a PVA layer was further formed by coating to obtain an image forming medium of the present invention.

In respect of this image forming medium, $f(\lambda)$ and $g(\lambda)$ were measured according to the measuring method as previously described. Results obtained are shown in Table 1.

The image forming medium of the present Example, on which a mask was laid overlapping, was further imagewise exposed to light for 2 seconds through a filter that transmits the light of 390 nm but does not pass the light of 440 nm or more, using an ultra-high-pressure mercury lamp having an electric power of 500 W, with a distance of 60 cm from the medium. The mask was thereafter removed, and the medium was heated for 16 seconds using a heat-developing machine regulated at 110° C.

Thereafter, the filter was removed, and the polymerization exposure was carried out for 10 seconds using the above ultra-high-pressure mercury lamp with a distance of 60 cm from the medium, to form a polymer image. Subsequently, the PVA layer was removed by washing with water, followed by etching with ethanol. As a result, the polymerized area of the polymer image remained on the PET film. In the present Example, it was also possible to obtain the image by etching, even when the exposure time for the polymerization exposure was varied within the range of from 5 seconds to 30 seconds.

EXAMPLE 12

Example 11 was repeated to obtain an image forming medium of the present invention, except that 3.4 parts of 4,4'-methylenebis(2-methyl-1-naphthol) in Example 11 was replaced with 3.6 parts of 4,4'-methylenebis(2-t-butyl-1-naphthol).

In respect of this image forming medium, $f(\lambda)$ and $g(\lambda)$ were measured according to the measuring method as previously described. Results obtained are shown in Table 1.

The image forming medium of the present invention was further subjected to formation of a polymer image in the same manner as Example 11, followed by etching with ethanol. As a result, the polymerized area of the polymer image remained on the PET film. In the present Example, it was also possible to obtain the image by etching, even when the exposure time for the polymerization exposure was varied within the range of from 2 seconds to 20 seconds.

EXAMPLE 13

Example 11 was repeated to obtain an image forming medium of the present invention, except that 3.4 parts of 4,4'-methylenebis(2-methyl-1-naphthol) in Example 11 was replaced with 4.9 parts of 4,4'-methylenebis(2-benzyl-1-naphthol).

In respect of this image forming medium, f(λ) and g(λ) were measured according to the measuring method as previously described. Results obtained are shown in Table 1.

The image forming medium of the present Example was further imagewise exposed to light in the same manner as Example 11, and hereafter heated for 16 seconds using a heat-developing machine regulated at 120° C. The resulting image forming medium was thereafter subjected to polymerization exposure in the same manner as Example 11, followed by washing with water and then etching with ethanol. As a result, the polymerized area of the polymer image remained on the PET film. In the present Example, it was also possible to obtain the image by etching, even when the exposure time for the polymerization exposure was varied within the range of from 5 seconds to 15 seconds.

EXAMPLE 14

A solution having the following composition was prepared.

| | |
|---|---|
| Polymethyl methacrylate | 0.26 part |
| Dipentaerythritol hexaacrylate | 10 parts |
| 3,3'-Carbonylbis(7-diethylaminocumarine) | 0.6 part |
| 1,3,5-Tris(trichloromethyl)triazine | 1.3 parts |
| MS-Cyan-VP (a product of Mitsui Toatsu Chemicals, Inc.) | 2.5 parts |
| Methyl ethyl ketone | 60 parts |

Using this solution, a polymerizing layer was formed by coating on a PET film so as to give a dried film thickness of 2 μm to provide the polymerization material as shown in FIG. 12.

In a separate system therefrom, a photosensitive composition having the following composition was prepared.

| | |
|---|---|
| Behenic acid | 2.5 parts |
| Silver behenate | 4.5 parts |
| Silver bromide | 0.9 part |
| Polyvinyl butyral | 10.0 parts |
| Phthalazinone | 1.2 parts |
| 4,4'-Methylenebis(2-methyl-1-naphthol) | 3.4 parts |
| Xylene | 60 parts |
| n-Butanol | 60 parts |

Using this dispersion, this was coated on another PET film so as to give a dried film thickness of 6 μm to provide a photosensitive layer, and on this photosensitive layer, a PVA layer was provided to give the photosensitive material as shown in FIG. 12.

In respect of the above polymerization material and photosensitive material, f(λ) and g(λ) were measured according to the measuring method as previously described. Results obtained are shown in Table 1.

The above photosensitive material was further imagewise exposed to light in the same manner as Example 11, and then heated for 10 seconds using a heat-developing machine regulated at 115° C.

Thereafter, the photosensitive material and polymerization material were laid overlapping in the manner that the PVA layer and polymerizing layer may face each other, followed by polymerization exposure for 20 seconds from the photosensitive material side, using the same light source as Example 11, while heating with a hot plate of 80° C. The photosensitive material was peeled, and thereafter the polymerization material was etched with methyl ethyl ketone. As a result, the polymerized area of the polymer image remained on the PET film.

In place of the etching, an image receiving paper coated with polyester resin was also laid overlapping on the polymer image on the polymerization material, and these were passed through heat rollers with a nip width of 4 mm, regulated at 130° C., and at a speed of 1.3 sec/cm. As a result, a cyan image corresponding with the imagewise exposure was formed on the image receiving paper.

EXAMPLE 15

A dispersion having the following composition was prepared in a darkroom.

| | |
|---|---|
| Behenic acid | 2.5 parts |
| Silver behenate | 4.5 parts |
| Silver iodobromide | 0.7 part |
| Polymethyl methacrylate | 10.0 parts |
| Trimethylolpropane triacrylate | 10.0 parts |
| 3,3'-Carbonylbis(7-diethylaminocumarine) | 0.6 part |
| Ethyl 4-dimethylaminobenzoate | 0.6 part |
| 2-t-Butyl-4-(4-hydroxyphenyl)methyl-1-naphthol | 2.9 parts |
| Xylene | 60.0 parts |
| n-Butanol | 60.0 parts |

A homomixer was used to carry out dispersion, and the resulting dispersion was coated on a support comprising a PET film so as to give a dried film thickness of 6 μm to prepare an image forming medium of the present invention.

In respect of this image forming medium, f(λ) and g(λ) were measured according to the measuring method as previously described. Results obtained are shown in Table 1.

On the image forming layer of the above image forming medium, an anodized aluminum sheet was laminated, and a mask was laid overlapping on the PET film. The resulting medium was imagewise exposed to light for 1 second using a 10 W fluorescent lamp. Thereafter, the mask was removed, followed by heating using a heat-developing machine under conditions of 115° C. for 16 seconds.

The image forming medium was thereafter subjected to polymerization exposure for 5 seconds using ultraviolet light that gave 8.0 mW/cm² at the surface of the image forming medium.

The PET film on the above image forming medium was peeled, followed by etching with ethanol. As a result, the polymerized area of the polymer image remained on the support as a sharp image.

The above conditions for the polymerization exposure were varied. As a result, it was possible to take out images with a good reproducibility when the exposure time for the polymerization exposure was within the range of from 3 seconds to 6 seconds.

EXAMPLE 16

A dispersion having the following composition was prepared in a darkroom.

| | |
|---|---|
| Palmitic acid | 1.6 parts |

| | |
|---|---|
| -continued | |
| Behenic acid | 0.4 part |
| Silver behenate | 4.0 parts |
| Silver bromide | 0.9 part |
| Methyl methacrylate/styrene (8/2) copolymer | 12.0 parts |
| Trimethylolpropane triacrylate | 4.0 parts |
| Dipentaerythritol hexaacrylate | 6.5 parts |
| 3,3'-Carbonylbis(7-diethylaminocumarine) | 0.5 part |
| p-Diethylaminobenzonitrile | 0.2 part |
| 2-Methyl-4-(3,5-dichloro-4-hydroxyphenyl)methyl-1-naphthol | 3.2 parts |
| Toluene | 80.0 parts |
| i-Propanol | 40.0 parts |

This dispersion was coated on a support comprising a PET film to give a dried film thickness of 8 μm. An image forming medium of the present invention was thus prepared.

In respect of this image forming medium, f(λ) and g(λ) were measured according to the measuring method as previously described. Results obtained are shown in Table 1.

On the above image forming medium, an aluminum sheet was laminated, followed by etching in the same manner as Example 15. As a result, the polymerized area of the polymer image remained on the support as a sharp image.

The above conditions for the polymerization exposure were varied. As a result, it was possible to take out images with a good reproducibility when the exposure time for the polymerization exposure was within the range of from 3 seconds to 14 seconds.

EXAMPLE 17

A dispersion having the following composition was prepared in a darkroom.

| | |
|---|---|
| Behenic acid | 2.5 parts |
| Silver behenate | 4.5 parts |
| Silver bromide | 0.7 part |
| Polyvinyl butyral | 0.4 part |
| Polymethyl methacrylate | 10.0 parts |
| 2,4-Bis[2-(acryloxy)ethoxycarbamoyl]toluene | 4.0 parts |
| Pentaethythritol triacrylate | 8.0 parts |
| 3,3'-Carbonylbis(7-pyrrolidinocumarine) | 0.7 part |
| Ethyl 4-dimethylaminobenzoate | 0.4 part |
| Phthalazinone | 0.8 part |
| 2-Methyl-4-(3,5-dimethyl-4-hydroxyphenyl)methyl-1-naphthol | 3.1 parts |
| Toluene | 80 parts |
| i-Propanol | 40 parts |

The dispersion with the above composition was coated on a support comprising a PET film so as to give a dried film thickness of 5 μm to prepare an image forming medium of the present invention. In this image forming medium, a polyurethane layer was provided as a subbing layer of the image forming layer.

In respect of this image forming medium, f(λ) and g(λ) were measured according to the measuring method as previously described. Results obtained are shown in Table 1.

On the image forming layer of the above image forming medium of the present invention, a polyethylene film was laminated, followed by the same manner as Example 15. As a result, a sharp image comprised of the polymerized area of the polymer image was obtained on the support.

EXAMPLE 18

Example 15 was repeated to prepare an image forming medium of the present invention, except that 2.9 parts of 2-t-butyl-4-(4-hydroxyphenyl)methyl-1-naphthol was replaced with 2.9 parts of 2-methyl-4-(4-dimethylaminophenyl)methyl-1-naphthol.

In respect of this image forming medium, f(λ) and g(λ) were measured according to the measuring method as previously described. Results obtained are shown in Table 1.

This image forming medium was subjected to the same manner as Example 15. As a result, the polymerized area of the polymer image remained on the support as a sharp image.

The above conditions for the polymerization exposure were varied. As a result, it was possible to take out images with a good reproducibility when the exposure time for the polymerization exposure was within the range of from 3 seconds to 8 seconds.

EXAMPLE 19

| | |
|---|---|
| Heat-diffusible dye, MS-Magenta-VP (a product of Mitsui Toatsu Chemicals, Inc.) | 1.5 parts |
| Polybutyl methacrylate | 7.0 parts |

The above components were dissolved in 50 parts of methyl ethyl ketone to make Solution H.

| | |
|---|---|
| Polyvinyl butyral | 8.0 parts |
| Dipentaerythritol hexaacrylate | 12.0 parts |
| 2,4-Diethylthioxanthone | 2.4 parts |
| Ethyl 4-dimethylaminobenzoate | 2.4 parts |

The above components were dissolved in 80 parts of butanol to make Solution I.

Next, 3.5 parts of behenic acid, 0.8 parts of AgBr, 4.0 parts of silver behenate, 10.0 parts of polyvinyl butyral, 0.2 part of azelaic acid, 0.8 part of phthalazinone and 4.5 parts of 4,4'-benzylidenebis(2,6-di-t-butylphenol) were dispersed in a mixed solution of 30 parts of toluene and 30 parts of i-propanol to make Solution J.

Next, on the PET film, Solution H was coated so as to give a dried film thickness of 2 μm to form a coloring material layer, and then Solution I was coated thereon so as to give a dried film thickness of 4 μm to form a polymerizing layer. On the polymerizing layer, Solution J was further coated so as to give a dried film thickness of 5 μm to form a photosensitive layer, and, finally on the photosensitive layer, a PVA layer with a thickness of 2 μm was provided. An image forming method of the present invention was thus obtained.

In respect of this image forming medium, f(λ) and g(λ) were measured according to the measuring method as previously described. Results obtained are shown in Table 1.

A mask was laid overlapping on this image forming medium, and the resulting medium was imagewise exposed to light for 10 seconds using light that gave 900 lux at the part of the image forming layer, and subsequently heated for 30 seconds using a heat-developing machine regulated at 125° C. Next, this image forming medium was subjected to polymerization exposure for 10 seconds using a fluorescent lamp having a peak wavelength at 380 nm, with a distance of 3 cm from the image forming medium.

In this way, as a final step, the PVA layer and photosensitive layer were removed and an image was formed on an image receiving paper in the same manner as Example 6. As a result, an image corresponding with the imagewise exposed area was obtainable on the image receiving paper. The image obtained in the present Example showed a lower maximum optical density compared with Example 6, but there was no practical problems.

Also, the image forming medium was subjected to imagewise exposure, heat development and polymerization exposure, followed by etching with ethanol in the same manner as Example 6. As a result, an image comprised of the polymerized area of the polymer image was obtainable on the PET film. The above conditions for the polymerization exposure were also varied. As a result, it was possible to take out images comprised of the polymerized area of the polymer image, with a good reproducibility when the exposure time for the polymerization exposure was within the range of from 5 seconds to 8 seconds.

EXAMPLE 20

Example 11 was repeated to prepare an image forming medium of the present invention, except that in Example 11, 3.4 parts of 4,4'-methylenebis(2-methyl-1-naphthol) was replaced with 1.7 parts of 2-amino-5-diethylaminotoluene and 4.6 parts of benzoylaceto-o-chloroanilide, and the image formation was carried out in the same way. As a result, a sharp image of polymer was obtained.

On the other hand, no image was obtained when the benzoylaceto-o-chloroanilide was not used.

EXAMPLE 21

| Yellow coating solution: | |
|---|---|
| Polybutyl methacrylate (Dianal BR-79; Mitsubishi Rayon Co. Ltd.) | 7.0 parts |
| MS-Yellow-VP (a dye of Mistui Toatsu Chemicals, Inc.) | 1.0 part |
| Methyl ethyl ketone | 63 parts |
| Magenta coating solution: | |
| Polybutyl methacrylate (Dianal BR-79; Mitsubishi Rayon Co. Ltd.) | 7.0 parts |
| MS-Magenta-VP (a dye of Mistui Toatsu Chemicals, Inc.) | 0.6 part |
| Methyl ethyl ketone | 63 parts |
| Cyan coating solution: | |
| Polybutyl methacrylate (Dianal BR-79; Mitsubishi Rayon Co. Ltd.) | 7.0 parts |
| MS-Cyan-VP (a dye of Mistui Toatsu Chemicals, Inc.) | 0.95 part |
| Methyl ethyl ketone | 63 parts |

The yellow coating solution, magenta coating solution and cyan coating solution each having the above composition were made up. On a 22 μm thick PET film having been subjected to anchoring, these solutions were coated dividedly for each color region, using a three-color gravure coater, to form a coloring material layer. The coloring material layer had a dried film thickness of 2 μm.

Next, an emulsion with the following composition was prepared.

| | |
|---|---|
| AgBr | 0.9 part |
| Silver behenate | 5.0 parts |
| Behenic acid | 4.0 parts |
| Phthalazinone | 1.0 part |
| Polyvinyl butyral | 10.0 parts |
| 2,6-Di-t-butyl-4-(3,5-dimethyl-4-hydroxyphenyl)methylphenol | 3.7 parts |
| 2,4-Diethylthioxanthone | 1.6 parts |
| Ethyl dimethylbenzoate | 1.6 parts |
| Dipentaerythritol hexaacrylate | 10.0 parts |
| 1 wt. % DMF solution of the sensitizing dye used in Example 5 | 2.0 parts |
| Xylene | 60.0 parts |
| n-Butanol | 60.0 parts |

This emulsion was coated on the above coloring material layer so as to give a dried film thickness of 5 μm to form a photosensitive polymerizing layer. A protective layer with a dried film thickness of 2 μm was further provided thereon by use of polyvinyl butyral to obtain an image forming medium of the present invention.

On the photosensitive polymerizing layer on the yellow layer of the above image forming medium, image writing was carried out with a He-Ne laser (output: 5 mW), using a drum-scanning laser beam printer (manufactured by Abe Sekkei). Next, this image forming medium was heated under conditions of 120° C. and 20 seconds, and thereafter exposed to light for 40 seconds using a fluorescent lamp having an electric power of 10 W and a fluorescent peak at 390 nm, with a distance of 1 cm from the medium. Finally, an image receiving paper on which an image receiving layer was previously formed and the above image forming medium were laminated, followed by heating under conditions of 130° C. and 10 seconds. As a result, a yellow image excellent in both the brightness and chroma, corresponding with the imagewise exposure, was formed on the image receiving paper.

Similarly, on the photosensitive polymerizing layer on the magenta layer of the above image forming medium, image writing and heat development were carried out under the same conditions as the case of the yellow image formation. Thereafter, the resulting image forming medium was exposed to light for 30 seconds using a fluorescent lamp having an electric power of 10 W and a fluorescent peak at 380 nm, with a distance of 1 cm from the medium. Finally, an image receiving paper on which the yellow image had been formed and the above image forming medium were laminated, followed by heating under conditions of 130° C. and 10 seconds. As a result, a magenta image excellent in both the brightness and chroma, corresponding with the imagewise exposure, was formed on the image receiving paper.

Similarly, on the photosensitive polymerizing layer on the cyan layer of the above image forming medium, image writing and heat development were carried out under the same conditions as the case of the yellow image formation. Thereafter, the resulting image forming medium was exposed to light for 30 seconds using a fluorescent lamp having an electric power of 10 W and a fluorescent peak at 390 nm, with a distance of 1 cm from the medium. Finally, an image receiving paper on which the yellow image and magenta image had been formed and the above image forming medium were laminated, followed by heating under conditions of 130° C. and 10 seconds. As a result, a cyan image excellent in both the brightness and chroma, corresponding with the imagewise exposure, was formed on the image receiving paper.

The full-color image thus obtained was an image having excellent brightness and chroma.

EXAMPLE 22

The cyan coating solution used in Example 21 was coated on a PET film so as to give a dried film thickness of 3 μm to form a coloring material layer.

Apart from this solution, 5 parts of polyvinyl butyral, 7 parts of dipentaerythritol hexaacrylate, 1.4 parts of 2,4-diethylthioxanthone and 1.4 parts of ethyl p-dimethylaminobenzoate were dissolved in 80 parts of n-butanol to make Solution L.

In addition, 0.9 part of AgBr, 5.0 parts of silver behenate, 4.0 parts of behenic acid, 1.0 part of phthalazinone, 10.0 parts of polyvinyl butyral and 3.7 parts of 2,6-di-t-butyl-4-(3,5-dimethyl-4-hydroxyphenyl)methyl-phenol were dispersed in a solution of 60 parts of toluene and 60 parts of i-propanol to make Solution M.

On the above coloring material layer, Solution L was coated so as to give a dried film thickness of 4 μm to form a polymerizing layer. On this polymerizing layer, Solution M was further coated so as to give a dried film thickness of 4 μm to form a photosensitive layer. On the photosensitive layer, an ethanol solution of polyvinyl butyral was coated with a film thickness of 2 μm to form a protective layer. An image forming medium of the present invention was thus prepared.

This image forming medium was imagewise exposed to light for 10 seconds using a tungsten lamp that gave an illumination of 900 lux at the surface of the medium, followed by heating for 20 seconds using a heat-developing machine regulated at 120° C. Subsequently, the resulting medium was exposed to light for 30 seconds using a fluorescent lamp having an electric power of 10 W and a fluorescent peak at 380 nm, with a distance of 1 cm from the medium. Finally, on the resulting image forming medium, an image receiving paper having thereon an image receiving layer comprising polyester resin was laid overlapping, followed by heating at 130° C. for 10 seconds. As a result, a cyan image was formed on the image receiving paper.

EXAMPLE 23

In a mixed solution of 60 parts of toluene and 60 parts of i-propanol, 0.7 part of AgBr, 4.5 parts of silver behenate, 3.2 parts of behenic acid, 9.0 parts of polyvinyl butyral, 10 parts of trimethylolpropane triacrylate, 0.6 part of p-dimethylaminobenzoic acid, 1.5 parts of 3,3'-carbonylbis(7-dimethylaminocumarine) and 0.6 part of camphorquinone were dispersed. In the resulting dispersion, 3.5 parts of a leuco dye 9-phenyl-2,7-dichloro-3,6-dihydroxyxanthene was dissolved. Preparation of an emulsion was thus completed.

This emulsion was coated on a PET film so as to give a dried film thickness of 5 μm to form an image forming layer. On this image forming layer, a PVA layer with a dried film thickness of 2 μm was further provided to prepare an image forming medium of the present invention.

This image forming medium was imagewise exposed to light for 2 seconds through a filter that does not pass the light of 440 nm or more, using an ultra-high-pressure mercury lamp having an electric power of 500 W, with a distance of 60 cm from the medium. The medium was subsequently heated for 16 seconds using a heat-developing machine regulated at 115° C. The filter was thereafter removed, and the resulting medium was subjected to polymerization exposure for 5 seconds using the ultra-high-pressure mercury lamp with a distance of 60 cm from the medium. The PVA layer was removed by washing with water, and the resulting medium was etched with ethanol. As a result, a polymer image remained on the PET film.

TABLE 1

| Example | $A_2$ | $A_3$ | $A_4$ | $\lambda_6$ (nm) | $\lambda_3$ (nm) | $W_{\frac{1}{2}}$ (nm) | a | k |
|---|---|---|---|---|---|---|---|---|
| 1 | 1.85 | 1.26 | 0.62 | 383 | 398 | 40 | 0.375 | 1.93 |
| 2 | 1.54 | 0.72 | 0.48 | 340 | 343 | 39 | 0.077 | 2.38 |
| 3 | 1.83 | 1.25 | 0.61 | 383 | 398 | 40 | 0.375 | 1.96 |
| 4 | 1.26 | 1.14 | 0.52 | 383 | 405 | 65 | 0.338 | 2.79 |
| 5 | — | — | — | — | — | — | — | — |
| 6 | 1.62 | 1.27 | 0.30 | 377 | 396 | 58 | 0.328 | 1.79 |
| 7 | — | — | — | — | — | — | — | — |
| 8 | 1.58 | 0.91 | 0.35 | 340 | 355 | 41 | 0.366 | 2.15 |
| 9 | 1.32 | 0.80 | 0.27 | 401 | 395 | 57 | 0.105 | 2.71 |
| 10 | — | — | — | — | — | — | — | — |
| 11 | 1.67 | 1.09 | 0.41 | 453 | 448 | 46 | 0.109 | 2.05 |
| 12 | 2.09 | 1.07 | 0.49 | 452 | 460 | 41 | 0.195 | 1.58 |
| 13 | 1.83 | 1.08 | 0.44 | 454 | 442 | 51 | 0.196 | 1.84 |
| 14 | 1.70 | 1.03 | 0.46 | 453 | 448 | 46 | 0.109 | 2.05 |
| 15 | 1.57 | 1.16 | 0.39 | 451 | 420 | 39 | 0.794 | 2.22 |
| 16 | 1.98 | 1.12 | 0.32 | 452 | 417 | 60 | 0.583 | 1.61 |
| 17 | 1.14 | 1.46 | 0.35 | 458 | 425 | 71 | 0.465 | 3.35 |
| 18 | 0.98 | 1.12 | 0.42 | 448 | 460 | 52 | 0.231 | 4.61 |
| 19 | 2.25 | 1.13 | 0.46 | 383 | 402 | 38 | 0.500 | 1.42 |

$a = |\lambda_6 - \lambda_3| / W_{\frac{1}{2}}$
$k = G(\lambda_3)/(A_2 - A_4)$

COMPARATIVE EXAMPLE 1

Example 1 was repeated to prepare an image forming medium, except that 2.6 parts of a reducing agent 2,2'-methylenebis(4-methyl-6-t-butylphenol) was used in place of 3.2 parts of the reducing agent 4,4'-methylenebis(2,6-di-t-butylphenol) in Example 1.

The above image forming medium was imagewise exposed to light in the same manner as Example 1, followed by heating for 10 seconds using a heat-developing machine regulated at 115° C. As a result, a black silver image was formed at the imagewise exposed area. In respect of the imagewise exposed area of this image forming medium, the light-absorption characteristics were measured to find that substantially flat absorption was seen. The optical density at 380 nm was 1.2. Conditions for the heat-development were varied, but no changes were seen in the flat absorption.

Next, the above image forming medium was exposed to imagewise exposure, heat-development and polymerization exposure in the same manner as Example 1, followed by etching. As a result, the image forming layer was entirely dissolved out when the exposure time for the polymerization exposure was 2 seconds or less, and the image forming layer was not dissolved out when the time was longer than 2 seconds. Thus, no image was obtainable.

COMPARATIVE EXAMPLE 2

Example 11 was repeated to prepare an image forming medium, except that 0.6 part of 3,3'-carbonylbis(7-diethylaminocumarine) and 0.6 part of camphorquinone in Example 11 were replaced with 0.5 part of 2,4-dichlorothioxanthone.

In respect of this image forming medium, f(λ) and g(λ) were measured according to the measuring method as previously described, to reveal that the absorption peak wavelength of f(λ) was greatly deviated from the absorption peak wavelength of g(λ). Results of measurement were as follows: $A_2=1.61$, $A_3=0.98$, $A_4=0.40$, $W_{\frac{1}{2}}=46$ nm, $\lambda_2=401$ nm, $\lambda_3=448$ nm, and $k=2.15$.

This image forming medium was subjected to the image formation in the same manner as Example 11, but there was obtained no sharp image.

Comparative Example 3

Example 1 was repeated to prepare an image forming medium, except that 0.4 part of the photopolymerization initiator 2,4-diethylthioxanthone and 0.6 parts of ethyl 4-dimethylaminobenzoate in Example 1 were replaced with 0.7 part of 3,3'-carbonylbis(7-diethylaminocumarine) and 0.5 part of 2,4,6-tris(trichloromethyl)-S-triazine.

In respect of this image forming medium, f(λ) and g(λ) were measured according to the measuring method as previously described, to reveal that the absorption peak wavelength of f(λ) was greatly deviated from the absorption peak wavelength of g(λ). Results of measurement were as follows: $A_2=1.80$, $A_3=1.20$, $A_4=0.53$, $W_{\frac{1}{2}}=40$ nm, $\lambda_2=457$ nm, $\lambda_3=398$ nm, and $k=1.94$.

This image forming medium was subjected to the image formation in the same manner as Example 1, but there was obtained no sharp image.

We claim:

1. A light sensitive material comprising a support and an image-forming layer on the support, said image-forming layer comprising:
   (i) a light-absorbing organic compound;
   (ii) an ethylenically unsaturated monomeric material; and
   (iii) a photopolymerization initiator;
   wherein said light absorbing organic compound is formed by (iv) imagewise exposing to light said image forming layer containing a reducing agent, a photosensitive silver halide and an organic silver salt selected from the group consisting of silver salts of (a) aliphatic carboxylic acids, (b) aromatic carboxylic acids, (c) thiocarbonyl compounds having a mercapto group, (d) thiocarbonyl compounds having α-hydrogen and (e) amino group-containing compounds, to form a silver latent image and (v) thereafter heating said image-forming layer to initiate a redox reaction between said reducing agent and said organic silver salt, said redox reaction catalyzed by said silver latent image to thereby form said light-absorbing organic compound; and said light-absorbing organic compound absorbing light at wavelengths to which said polymerization initiator is sensitive, wherein the absorption peak wavelength ($\lambda_6$) of said photopolymerization initiator is within the range $\lambda_3 \pm 0.8\ W_{\frac{1}{2}}$, where $\lambda_3$ is the absorption peak wavelength of said light absorbing organic compound and $W_{\frac{1}{2}}$ is the half-width of a second difference spectrum F(λ); and
   wherein the first difference spectrum G(λ) of said light sensitive material, the light-absorption characteristics f(λ) of an area of said light sensitive material imagewise exposed to light and heated and the light absorption characteristics g(λ) of an area of said light sensitive material not imagewise exposed to light and heated are related as $G(\lambda_3)/f(800)-g(800)=k$ and wherein k is $\geq 1.5$.

2. A light sensitive material according to claim 1, wherein, said absorption peak wavelength $\lambda_6$ is within the range of $\lambda_3 \pm 0.5\ W_{\frac{1}{2}}$.

3. A light sensitive material according to claim 1, wherein said reducing agent is a compound represented by the following Formula (I):

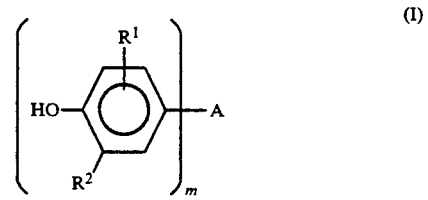

wherein $R^1$ and $R^2$ each independently represent a hydrogen atom, a hydroxyl group, a halogen atom, a substituted or unsubstituted alkyl group, a substituted or unsubstituted alkenyl group, a substituted or unsubstituted alkynyl group, a substituted or unsubstituted cycloalkyl group, a substituted or unsubstituted aralkyl group, an alkoxyl group, or a substituted or unsubstituted amino group; m represents an integer of 1 to 3; and A is a monovalent, divalent or trivalent group and represents a substituted or unsubstituted aralkyl group, a substituted or unsubstituted alkyl group, a substituted amino group, a divalent aralkylidene group, or a divalent alkylidene group, or a trivalent methine group.

4. A light sensitive material according to claim 1, wherein said reducing agent is a compound represented by the following Formula (II):

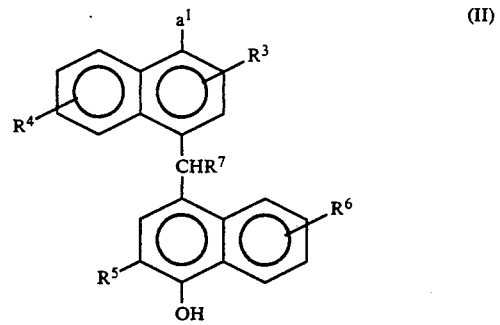

wherein $R^5$ represents a hydrogen atom, an alkyl group, a cycloalkyl group, or aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group; and $a^1$ represents a hydrogen atom, a hydroxyl group, a halogen atom, a substituted or unsubstituted alkyl group, a cycloalkyl group, an alkoxyl group, or a substituted or unsubstituted amino group.

5. A light sensitive material according to claim 1, wherein said reducing agent is a compound represented by the following Formula (III):

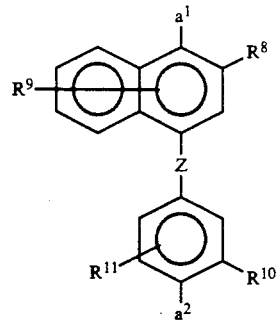

(III)

wherein $R^8$, $R^9$, $R^{10}$ and $R^{11}$ each independently represent a substituent selected from the group consisting of a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, and an acyl group; Z represents a divalent group; and $a^1$ and $a^2$ each represent a substituent selected from the group consisting of a hydrogen atom, a hydroxyl group, a halogen atom, a substituted or unsubstituted alkyl group, a cycloalkyl group, an alkoxyl group, and a substituted or unsubstituted amino group, provided that at least one of $a^1$ and $a^2$ is a hydroxyl group.

6. A light sensitive material according to claim 1, wherein said material further contains a heat-diffusible coloring matter.

7. A light sensitive material according to calim 1, comprising (i) a photosensitive layer containing at least said photosensitive silver halide, said organic silver salt and said reducing agent, and (ii) a polymerizing layer containing at least said ethylenically unsaturated monomeric material and said photopolymerization initiator.

8. A light sensitive material according to claim 7, wherein said polymerizing layer contains a heat-diffusible coloring matter.

9. A light sensitive material according to claim 1, comprising (i) a photosensitive layer containing at least said photosensitive silver halide, said organic silver salt and said reducing agent, (ii) a polymerizing layer containing at least said ethylenically unsaturated monomeric material and said photopolymerization initiator, and (iii) a coloring material layer containing at least a heat-diffusible coloring matter, which are provided in this order.

10. A light sensitive material according to claim 1, wherein said light sensitive material contains a coupler.

11. A light sensitive material according to claim 10, wherein, said absorption peak wavelength $\lambda_6$ is within the range of $\lambda_3 \pm 0.5\ W_{\frac{1}{2}}$.

12. A light sensitive material according to claim 1, wherein said material contains a coupler, and said reducing agent is selected from the group consisting of p-aminophenols, p-phenylenediamines, and o-aminophenols.

13. A light sensitive material according to claim 12, wherein said coupler is selected from the group consisting of α-acylacetamides, pyrazolones, phenols, and naphthols.

14. A light sensitive material according to claim 12, wherein said material contains a heat-diffusible coloring matter.

15. A light sensitive material according to claim 12, comprising: (i) a photosensitive layer containing at least said photosensitive silver halide, said organic silver salt, said coupler and said reducing agent, and (ii) a polymerizing layer containing at least said ethylenically unsaturated monomeric material and said photopolymerization initiator.

16. A light sensitive material according to claim 15, wherein said polymerizing layer contains a heat-diffusible coloring matter.

17. A light sensitive material according to claim 12, comprising: (i) a photosensitive layer containing at least said photosensitive silver halide, said organic silver salt, said coupler and said reducing agent, and (ii) a polymerizing layer containing at least said ethylenically unsaturated monomeric material and said photopolymerization initiator, and (iii) a coloring material layer containing at least a heat-diffusible coloring matter, which are provided in this order.

18. A light sensitive material according to claim 6, comprising (i) a coloring material layer containing at least said heat-diffusible coloring matter, and (ii) an image forming layer containing at least said photosensitive silver halide, said organic silver salt, said reducing agent, said ethylenically unsaturated monomeric material and said photopolymerization initiator.

* * * * *

UNITED STATES PATENT AND TRADEMARK OFFICE
CERTIFICATE OF CORRECTION

PATENT NO. : 5,171,657

DATED : December 15, 1992

INVENTOR(S) : KENJI KAGAMI, ET AL.

It is certified that error appears in the above-identified patent and that said Letters Patent is hereby corrected as shown below:

ON THE TITLE PAGE:

IN [56] REFERENCES CITED

Under U.S. PATENT DOCUMENTS, "Cerequone et al." should read --Cerquone et al.--.

Under OTHER PUBLICATIONS, "Patent Abstrat" should read --Patent Abstract--.

COLUMN 2

Line 50, "an" should read --a--.

COLUMN 3

Line 58, "so" should read --such--.

COLUMN 7

Line 5, "purport" should read --purview such--.

COLUMN 8

Line 1, "$g(\lambda),$" should read --$g(\lambda)),$--.
Line 11, "is" should read --are--.
Line 60, "iight-absorption" should read --light-absorption--.

COLUMN 9

Line 63, "of" should read --or--.

UNITED STATES PATENT AND TRADEMARK OFFICE
CERTIFICATE OF CORRECTION

PATENT NO. : 5,171,657
DATED : December 15, 1992
INVENTOR(S) : KENJI KAGAMI, ET AL.

It is certified that error appears in the above-identified patent and that said Letters Patent is hereby corrected as shown below:

COLUMN 12

Line 25, "unsabstituted" should read --unsubstituted--.
Line 35, "The" should read --the--.

COLUMN 13

Line 64, "propargyphenol," should read --propargylphenol,--.
Line 67, "2-texyl-4texyl-4-" should read
 --2-texyl-4-benzyl-5- --.
Line 68, "5methylphenol," should read --methylphenol,--.

COLUMN 14

Line 9, "-6-butylphenol)," should read
 -- -6-t-butylphenol),--.
Line 45, "also used" should read --also be used--.

COLUMN 16

Line 15, "also" should read --also be--.

COLUMN 18

Line 20, "react" should read --reacted--.

COLUMN 20

Line 40, "example;" should read --example:--.

COLUMN 25

Line 24, "the" should be deleted.

UNITED STATES PATENT AND TRADEMARK OFFICE
CERTIFICATE OF CORRECTION

PATENT NO. : 5,171,657
DATED : December 15, 1992
INVENTOR(S) : KENJI KAGAMI, ET AL.

It is certified that error appears in the above-identified patent and that said Letters Patent is hereby corrected as shown below:

COLUMN 28

Line 17, "$a=|\lambda_6-\lambda_3|/W_{178}$" should read --$a=|\lambda_6-\lambda_3|/W_{1/2}$--.

COLUMN 29

Line 22, "Example 3" should read --EXAMPLE 3--.

COLUMN 36

Line 2, "of 80°C." should read --at 80°C.--.

COLUMN 43

Line 12, "Comparative Example 3" should read
--COMPARATIVE EXAMPLE 3--.
Line 48, "(e) amino" should read --(e) imino--.

COLUMN 44

Line 25, "asubstituted" should read --a substituted--.

COLUMN 45

Line 32, "calim 1," should read --claim 1,--.
Line 42, "comprising" should read --comprising:--.

UNITED STATES PATENT AND TRADEMARK OFFICE
CERTIFICATE OF CORRECTION

PATENT NO. : 5,171,657
DATED : December 15, 1992
INVENTOR(S) : KENJI KAGAMI, ET AL.

It is certified that error appears in the above-identified patent and that said Letters Patent is hereby corrected as shown below:

<u>COLUMN 46</u>

Line 6, "wherein," should read --wherein--.
   Line 41, "comprising" should read --comprising:--

Signed and Sealed this

Eleventh Day of January, 1994

Attest:

BRUCE LEHMAN

Attesting Officer     Commissioner of Patents and Trademarks